(12) United States Patent
Verma et al.

(10) Patent No.: US 8,999,769 B2
(45) Date of Patent: Apr. 7, 2015

(54) INTEGRATION OF HIGH VOLTAGE TRENCH TRANSISTOR WITH LOW VOLTAGE CMOS TRANSISTOR

(75) Inventors: Purakh Raj Verma, Singapore (SG); Liang Yi, Singapore (SG); Yemin Dong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 233 days.

(21) Appl. No.: 13/552,607

(22) Filed: Jul. 18, 2012

(65) Prior Publication Data

US 2014/0021534 A1    Jan. 23, 2014

(51) Int. Cl.
| | |
|---|---|
| *H01L 21/332* | (2006.01) |
| *H01L 21/8238* | (2006.01) |
| *H01L 29/66* | (2006.01) |
| *H01L 29/78* | (2006.01) |
| *H01L 29/08* | (2006.01) |
| *H01L 29/423* | (2006.01) |
| *H01L 29/51* | (2006.01) |

(52) U.S. Cl.
CPC ....... *H01L 21/82385* (2013.01); *H01L 29/0878* (2013.01); *H01L 29/4236* (2013.01); *H01L 29/42368* (2013.01); *H01L 29/513* (2013.01); *H01L 29/518* (2013.01); *H01L 29/66689* (2013.01); *H01L 29/66704* (2013.01); *H01L 29/7825* (2013.01)

(58) Field of Classification Search
None
See application file for complete search history.

(56) References Cited

U.S. PATENT DOCUMENTS

| | | | |
|---|---|---|---|
| 6,359,308 B1* | 3/2002 | Hijzen et al. .................. 257/341 |
| 8,278,731 B2 | 10/2012 | Sumitomo et al. | |
| 2003/0006428 A1* | 1/2003 | Palm et al. ..................... 257/200 |
| 2006/0131647 A1 | 6/2006 | Meyer | |
| 2009/0152624 A1 | 6/2009 | Hiller et al. | |
| 2010/0244125 A1* | 9/2010 | Sonsky et al. ................. 257/330 |
| 2011/0127602 A1* | 6/2011 | Mallikarjunaswamy ..... 257/331 |

\* cited by examiner

*Primary Examiner* — Tan N Tran
*Assistant Examiner* — Scott R Wilson
(74) *Attorney, Agent, or Firm* — Horizon IP Pte Ltd

(57) ABSTRACT

A method of forming a device is disclosed. A substrate defined with a device region is provided. A gate having an upper and a lower portion is formed in a trench in the substrate in the device region. The upper portion forms a gate electrode and the lower portion forms a gate field plate. First and second surface doped regions are formed adjacent to the gate. The gate field plate introduces vertical reduced surface (RE-SURF) effect in a drift region of the device.

20 Claims, 38 Drawing Sheets

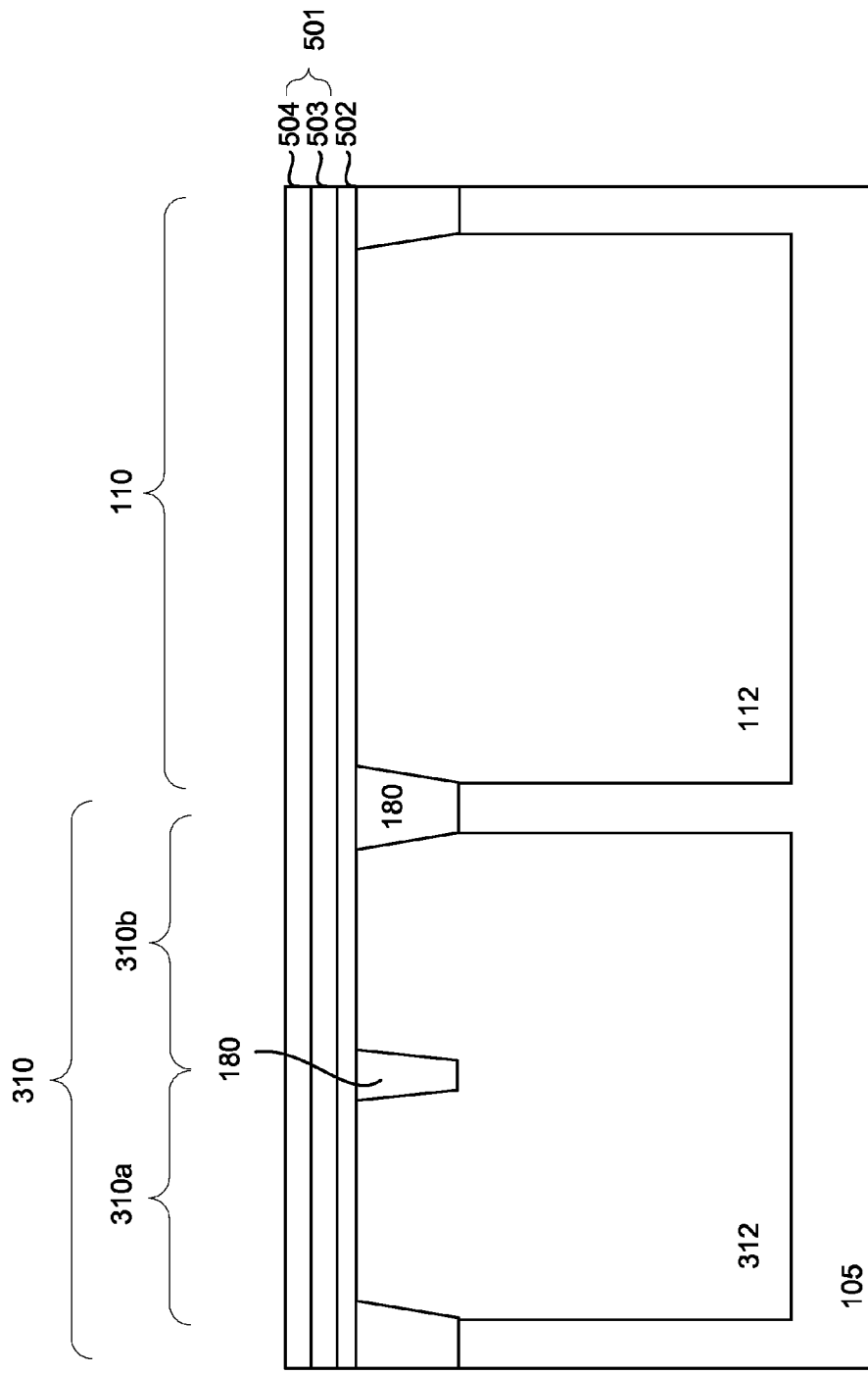

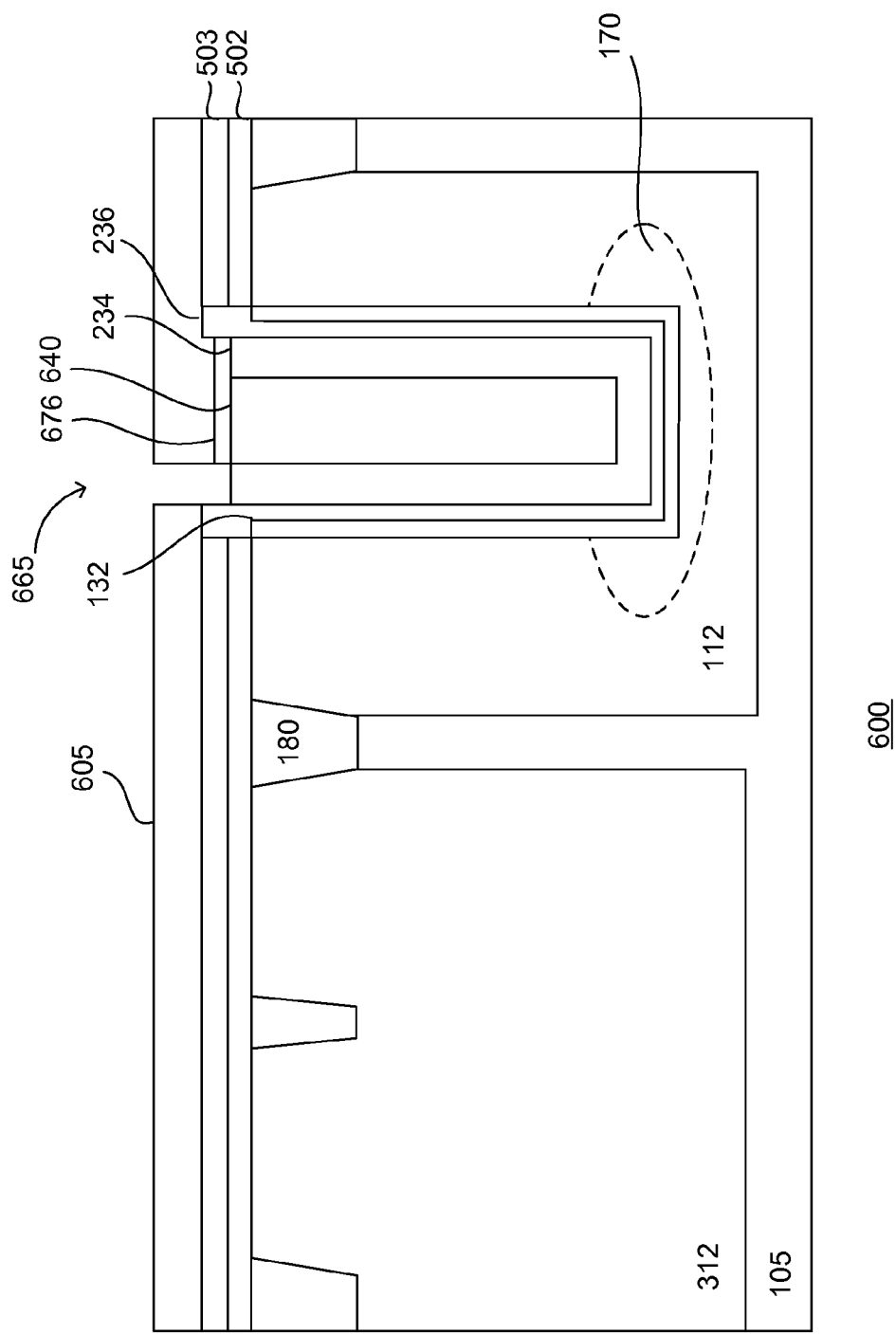

US 8,999,769 B2

INTEGRATION OF HIGH VOLTAGE TRENCH TRANSISTOR WITH LOW VOLTAGE CMOS TRANSISTOR

BACKGROUND

High voltage field-effect transistors having high breakdown voltage and low on-state resistance are used in, for example, power management products. Such high voltage field-effect transistors include lateral double-diffused (LD) transistors. The performance of the LD transistors depends on the drain-to-source on-resistance ($R_{dson}$) as well as breakdown voltage. For example, low $R_{dson}$ results in high switching speed while high breakdown voltage ($BV_{dss}$) increases reliability.

High breakdown voltage may be achieved by increasing the device pitch. For example, an expanded drain region may be provided along the surface of the substrate, increasing the drain-to-gate surface area on the substrate. The higher the desired breakdown voltage, the larger the expanded drain region or larger the drain-to-gate surface area on the substrate. This however increases gate-to-drain capacitance, resulting in a larger $R_{dson}$ which negatively impacts the switching speed of the transistor. As such, conventional LD transistors achieve a high breakdown voltage by sacrificing switching speed.

The disclosure is directed to transistors with fast switching speed and high breakdown voltage.

SUMMARY

A method of forming a device is disclosed. In one embodiment, the method includes providing a substrate defined with a device region. The method also includes forming a gate having an upper and a lower portion in a trench in the substrate in the device region. The upper portion forms a gate electrode and the lower portion forms a gate field plate. The method further includes forming first and second surface doped regions adjacent to the gate. The gate field plate introduces vertical reduced surface (RESURF) effect in a drift region of the device.

In one embodiment, a method of forming a semiconductor device is disclosed. The method includes providing a substrate defined with a device region. The method also includes forming a gate having an upper and a lower portion in a trench in the substrate in the device region. The upper portion forms a gate electrode and the lower portion forms a gate field plate. An inner edge of the gate field plate is offset from an inner edge of the gate electrode. The method further includes forming first and second surface doped regions adjacent to the gate. The gate field plate introduces vertical reduced surface (RESURF) effect in a drift region of the device.

In yet another embodiment, a semiconductor device is disclosed. The semiconductor device includes a substrate. The semiconductor device also includes a gate having an upper and a lower portion in a trench in the substrate. The upper portion forms a gate electrode and the lower portion forms a gate field plate. The semiconductor device further includes first and second surface doped regions adjacent to the gate. The gate field plate introduces vertical reduced surface (RESURF) effect in a drift region of the device.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. Some embodiments relate to devices, such as low power-loss buck and boost regulators, power amplifiers and power management circuits. Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1:
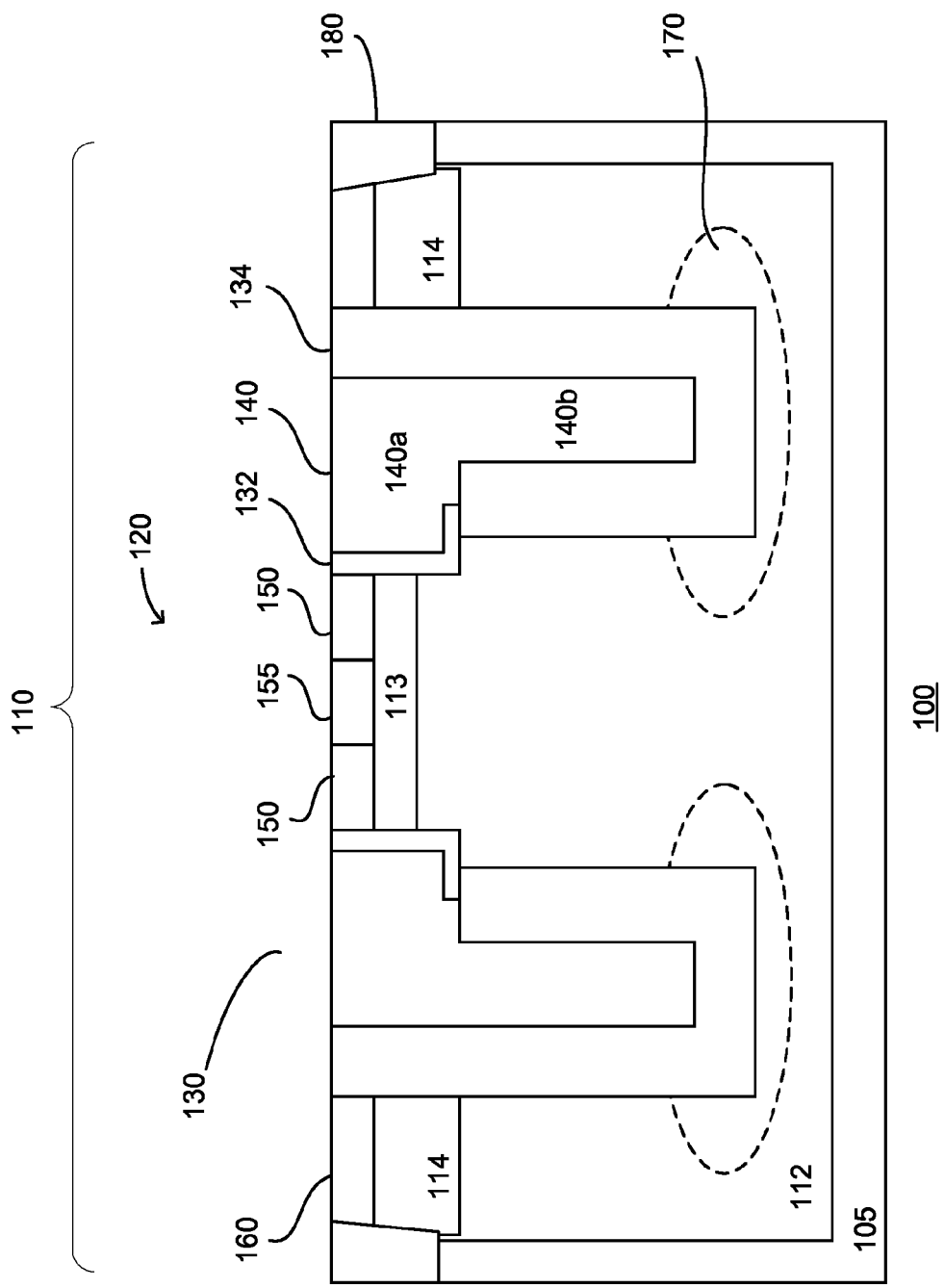
FIG. 1 showscross-sectional view of an embodiment of a device.

FIG. 1 shows a cross-sectional view of a device 100. A substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device includes a trench transistor 120 formed in a device region 110 defined on the substrate. A device isolation region 180 may be provided for isolating or separating the device region from other device regions on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 4000 Å for an STI region. Providing isolation regions which extend to other depths, such as 0.5-10 μm for DTI regions, may also be useful. In one embodiment, the width of the isolation region is about 0.3 μm. Providing isolation regions having different depths and widths may also be useful. The dimensions, for example, may depend on isolation requirements.

The device may include dope regions or wells having different dopant concentrations. For example, the device may include heavily doped, intermediate doped and lightly doped regions. The doped regions may be designated by $x^-$, x and $x^+$, where x indicates the polarity of the doping, such as p for p-type or n for n-type, and:

$x^-$=lightly doped;
x=intermediately doped; and
$x^+$=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15\,cm^3$-$9E15/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

In one embodiment, a first device doped well 112 is disposed in the substrate in the device region. The first device doped well, as shown, encompasses the complete device region. For example, the first device doped well is disposed in the substrate from about an inner edge of the isolation region. Providing the first device doped well which extends from the bottom of the isolation region between inner and outer edges of the isolation region is also useful. In one embodiment, the first device doped well is a deep device doped well. The deep device doped well is sufficiently deep to accommodate the trench transistor. The deep device doped well, for example, extends to a depth of about 3-5 µm. Providing the deep device doped well of different depth may also be useful.

The deep device doped well includes first polarity type dopants. In one embodiment, the deep device doped well is lightly doped with first polarity type dopants. For example, the dopant concentration of the deep device doped well may be about $1E11/cm^3$-$5E13/cm^3$. Providing a deep device doped well having other dopant concentrations may also be useful. In one embodiment, the first polarity type is n-type. For example, the deep device doped well may be $n^-$ doped well for n-type device. Providing p-type as the first polarity type is also useful.

The transistor, in one embodiment, is a high voltage (HV) transistor. The transistor includes various components. For example, the transistor includes first and second doped diffusion or source/drain (S/D) regions 150 and 160 and a gate 130. In one embodiment, the first S/D region is a source region and the second S/D region is a drain region of the transistor.

In one embodiment, the gate of the transistor is formed in a trench. For example, the gate is disposed in a trench formed in the substrate. The gate, for example, is disposed in the trench below a surface of the substrate. Providing a gate whose top surface is not coplanar with the substrate surface may also be useful. A top surface of the gate may be about coplanar with a top surface of the substrate. Illustratively, the cross-section includes first and second gates disposed in first and second trenches. For example, the cross-section shows first and second mirror halves of the transistor. The various components of the transistor may be arranged in a lateral configuration. Other configurations of the transistor may also be useful.

The gate includes a gate electrode 140 having upper and lower gate electrodes 140*a-b*. The upper gate electrode is disposed in an upper trench portion and the lower gate electrode is disposed in a lower trench portion. The upper gate electrode serves as a gate electrode and the lower gate electrode serves as a gate field plate. In one embodiment, the lower gate electrode is narrower than the upper gate electrode. As shown, the outer edge of the upper and lower gate electrodes adjacent to the drain may be aligned while the opposing or inner edge of the lower gate electrode is recessed from the inner edge of the upper gate electrode.

In one embodiment, the depth of the trench is about 1-5 µm. For example, the upper portion of the trench is from the surface to about 1 um while the lower portion of the trench is from about 1-5 um. Providing upper and lower portions having other depths may also be useful.

The gate electrode, in one embodiment, is formed of polysilicon. Other types of gate electrode materials may also be useful. For example, the gate electrode may be formed of tungsten (W). In one embodiment, the upper and lower gate electrodes are formed of a same material. Providing upper and lower gate electrodes having different materials may also be useful.

The gate includes a first gate dielectric layer 132. The first gate dielectric layer lines the inner edge of the upper gate electrode adjacent to the source. As shown, the first gate dielectric layer lines the inner edge of the upper gate electrode as well as a portion of a bottom of the upper gate electrode. For example, the first gate dielectric layer lines the inner edge of the upper gate electrode and wraps around to line a portion of the bottom of the upper gate electrode. In one embodiment, the outer surface of the first gate dielectric layer which wraps around a portion of the upper gate electrode is coplanar with the bottom surface of the upper gate electrode. The wrapping around of the first gate electrode layer ensures that the gate electrode is insulated from the substrate. The first gate dielectric layer, in one embodiment, is formed of silicon oxide. For example, the first gate dielectric layer is formed of thermal silicon oxide. Other types of gate dielectric materials may also be useful. The first gate dielectric layer, for example, is a thin gate dielectric layer having a thickness of about 100-1000 Å. Other gate dielectric thicknesses may also be useful. For example, the first gate dielectric thickness may depend on a maximum gate to source voltage ($V_{GS}$).

The gate includes a second gate dielectric layer 134. The second gate dielectric layer surrounds the lower gate electrode and outer edge of the upper gate electrode. The second gate dielectric layer, in one embodiment, is formed of silicon oxide. For example, the second gate dielectric layer is formed of thermal silicon oxide. Other types of gate dielectric materials may also be useful. The second gate dielectric layer, for example, is a thick gate dielectric layer having a thickness of about 0.1-1 µm. Other gate dielectric thicknesses may also be useful. For example, the second gate dielectric thickness may depend on a maximum operation voltage $V_d$.

The source and drain regions are heavily doped regions in the substrate adjacent to the gate. The drain region is disposed, in one embodiment, adjacent to an outer edge of the gate and inner edge of the device isolation region. In one embodiment, the drain region is a heavily doped region with first polarity type dopants. The dopant concentration of the drain region may be from about $5E15\,cm^3$-$9E15/cm^3$. Other dopant concentrations for the drain region may also be useful. For example, the drain region may be $n^+$ doped regions for a n-type device.

The drain region, in one embodiment, is disposed in a second device doped well 114. The second device doped well includes first polarity type dopants. In one embodiment, the second device doped well is an intermediately doped well with first polarity type dopants. For example, the second device doped well is a n well for a n-type device. The dopant concentration of the second device doped well may be from about $5E13$-$5E15/cm^3$. Other dopant concentration for the second device doped well may also be useful. The second device doped well has a dopant concentration between the first device doped well and the drain region.

The second device doped well, as shown, is disposed within the first device doped well. The second device doped well may have a depth greater than the device isolation region. For example, the second device doped well is from the outer edge of the gate to a bottom of the isolation region. Other depths may also be useful.

A third device doped well 113 is provided in the device region within the first device doped well. As shown, the third device doped well is disposed within the inner edge of the gate. For example, as shown by the cross-section, the third device well is disposed between inner edges of the gates. In one embodiment, the third device doped well is intermediately doped with second polarity type dopants. For example, the third device doped well has a dopant concentration of from about 5E13-5E15/cm$^3$. Other dopant concentrations may also be useful. In the case of a n-type device, the third device doped well is a p well. The third device doped well serves as a body well for the transistor. The depth of the third device doped well, as shown is shallower than the upper gate electrode. For example, the third device doped well is above the lower gate electrode. The bottom of the third device doped well may be about 0.1-2 μm deep. Other depths may also be useful.

In one embodiment, the source region is disposed in the third device doped well 113 and adjacent to the inner edge of the gate electrode. For example, as shown by the cross-section, the third source region is disposed between inner edges of the gates. The source region includes first polarity type dopants. In one embodiment, the source region is heavily doped with first polarity type dopants. The dopant concentration of the source region may be from about 5E15 cm$^3$-9E15/cm$^3$. Other dopant concentrations for the source region may also be useful. The source region, for example, may be n$^+$ doped regions for a n-type device. The depth of the source region is shallower than the third device doped well. For example, the source region may have a depth of about 0.1-0.2 μm. Providing source regions having other depths may also be useful. The source and drain regions, for example, may be formed in the same process. In this case, the source and drain regions may have similar characteristics.

In one embodiment, a body bias contact region 155 is provided to bias the body of the transistor. The body bias contact region, in one embodiment, is a heavily doped region with second polarity type dopants. For example, the body bias contact region has the same polarity type dopants as the third device doped well. The dopant concentration of the body bias contact region, for example, is from about 5E15 cm$^3$-9E15/cm$^3$. Other dopant concentrations may also be useful. The body bias region is disposed away from the gate. For example, the body bias contact region is disposed between the source regions of the gates. This separates the body bias contact region from the gate. The body bias contact and source regions are, for example, butt contact regions. In one embodiment, the body is biased with the same voltage as provided at the source.

A buried doped region 170 may be provided in the substrate within the first device doped well. As shown, the buried doped region surrounds a lower portion of the trench in which the gate is formed. For example, the buried doped region surrounds the lower portion of the lower gate electrode and second gate dielectric layer. The buried doped region serves as a drift well in the substrate. In one embodiment, the buried doped region is an intermediate doped region with first polarity type dopants. For example, the dopant concentration of the buried doped region may be from about 5E13-5E15/cm$^3$. In a case of a n-type device, the buried doped region may be an n doped region.

Contacts may be formed on the contact regions of the device, such as source and drain, body bias contact regions and gate contact region. In one embodiment, the contacts may be silicide contacts. Providing other types of contacts may also be useful.

A dielectric layer (not shown) may be disposed over the substrate. It is understood that there may be additional layers between the dielectric layer and the substrate, such as for example, an etch stop layer. The dielectric layer serves as an interlevel dielectric (ILD) layer. The dielectric layer may be, for example, silicon oxide. Other types of dielectric materials, such as doped SiO$_2$, Boron-doped Phophosilicate Glass (BPSG) or BorophosphosilicateTetraethylorthosilicate Glass (BPTEOS), may also be useful for the ILD layer.

Interconnects (not shown), which include contacts and conductive lines, are provided in the ILD layer. The device may include multiple interconnect levels. The interconnects, for example, provide connections to the silicide contacts of the device.

The vertical field plate introduces vertical reduced surface (RESURF) effect in the drift region. As such, high breakdown voltage and low R$_{dson}$ can be obtained. Furthermore, the trench transistor with the field plate results in a longer drift region without increasing surface area of the device. This allows the device to have a low gate-drain capacitance ($C_{dg}$). A low $C_{dg}$ greatly increases the performance of the device. For example, high switch speed can be achieved without sacrificing reliability (e.g., high BV$_{dss}$). In addition, the process of fabricating the trench transistor is compatible with current CMOS processes.

Figure 2:
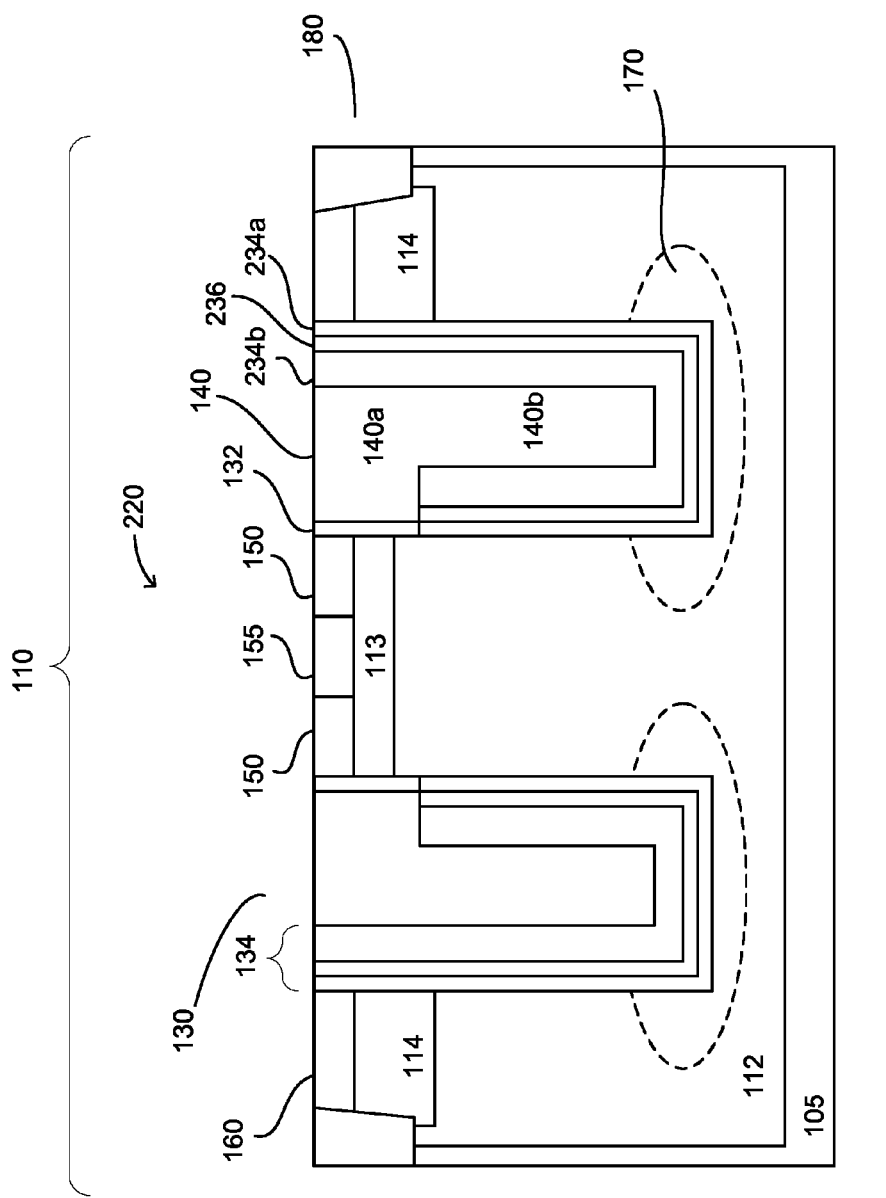
FIG. 2 showscross-sectional view of another embodiment of a device.

FIG. 2 shows a cross-sectional view of a device 200. The device is similar to the device shown in FIG. 1. As such, common elements may not be described or described in detail. The device, as shown, includes a trench transistor 220 disposed in a device region 110 of a substrate 105. An isolation region 180 may be provided to isolate the device region from other device regions on the substrate.

The transistor includes a gate 130, a source region 150 and a drain region 160. The drain region is adjacent to an outer edge of the gate and the source region is adjacent to an inner edge of the gate.

The gate is disposed in a trench formed in the substrate. The gate includes a gate electrode 140 with upper and lower gate electrodes 140a-b. In one embodiment, the upper gate electrode is wider than the lower gate electrode. As shown, the outer edges of the upper and lower gate electrodes are aligned while the inner edge of the lower gate electrode is recessed from the inner edge of the upper gate electrode.

The gate includes a first dielectric and second dielectric layers 132 and 134. The first gate dielectric layer lines an inner edge of the upper gate electrode and the second gate dielectric layer 134 lines the lower gate electrode and outer edge of the upper gate electrode. In one embodiment, the second gate dielectric layer is a multi-layered dielectric stack. The dielectric stack may include a nitride layer 236 sandwiched by first and second oxide layers 234a-b, forming an ONO stack. Other types of dielectric stacks may also be useful. In one embodiment, the first oxide layer has a thickness equal to about the thickness of the first gate dielectric layer while the second oxide layer is thicker. The first gate dielectric layer may be the same as the first oxide layer. The thickness of the first and second oxide layers, for example, may be about 100-1000 Å while the nitride layer may be about 100-1000 Å. In one embodiment, the effective gate oxide thickness of the dielectric stack may be about 0.1-1 um. Other thicknesses for the layers or effective dielectric thickness of the stack may also be useful.

Similar to device 100 described in FIG. 1, the vertical field plate of device 200 is created to introduce RESURF effect in the drift region. As such, high breakdown voltage and low $R_{dson}$ can be obtained. Moreover, the present device has longer drift region without increasing device area laterally, allowing the device to have low $C_{dg}$. This greatly increases the performance of the device as well as reliability. Furthermore, the process of fabricating the trench transistor, as previously described, is compatible with current CMOS processes.

Figure 3A:
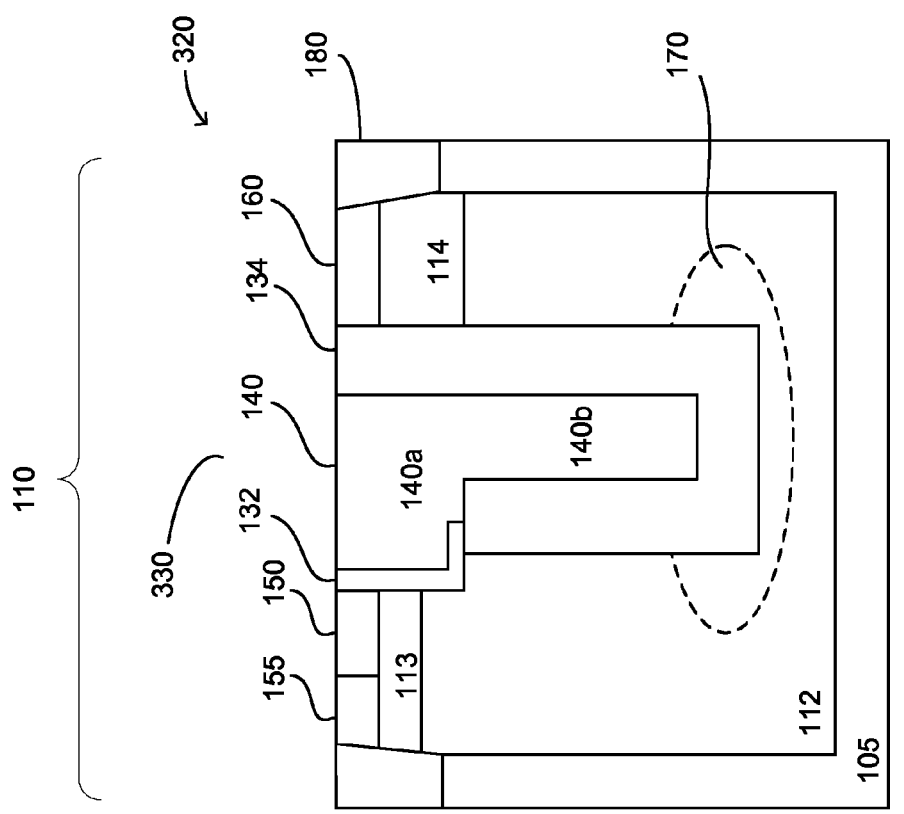
FIGS. 3a-b and 4a-b show cross-sectional views of different embodiments of devices.

FIG. 3a shows a cross-sectional view of another embodiment of a device 300a. The device is similar to the device shown in FIG. 1b. Common elements may not be described or described in detail. The device includes a trench transistor 320 disposed in a device region 110 of a substrate 105. The components of the trench transistor are disposed in a lateral configuration. The device region includes a first deep device doped well 112. The deep device doped well is a first polarity type doped well.

The transistor includes a gate 330, a source region 150 and a drain region 160. The source region is disposed on a first side of the gate and the drain region is disposed on a second opposing side of the gate. The source and drain regions are first polarity type doped regions. The drain region is disposed in a second device doped well 114. The second device doped well is a first polarity type well. The source region is disposed in a third device doped well 113. In one embodiment, the third device doped well is a second polarity type well. In one embodiment, a body bias contact region 155 is disposed in the third device well along with the source region. The source and body bias contact regions are, for example, abutting each other. In one embodiment, the source region is adjacent to the first side of the gate and the body bias contact region is displaced from the first side of the gate.

The gate is disposed in a trench formed in the substrate. The gate includes a gate electrode 140 having an upper gate electrode 140a disposed in an upper trench portion and a lower gate electrode 140b disposed in a lower trench portion. The upper gate electrode serves as a gate electrode and the lower gate electrode serves as a gate field plate. In one embodiment, the upper gate electrode is wider than the lower gate electrode. As shown, outer edges of the upper and lower gate electrodes are aligned while an inner edge of the lower gate electrode is recessed from an inner edge of the upper gate electrode.

The gate includes first and second gate dielectric layers 132 and 134. The first gate dielectric layer lines the inner edge of the upper gate electrode and wraps around to line a portion of the bottom of the upper gate electrode. In one embodiment, the outer surface of the wrap around portion of first gate dielectric layer is coplanar with the bottom surface of the upper gate electrode. As for the second gate dielectric layer 134, it surrounds the lower gate electrode and outer edge of the upper gate electrode. The second gate dielectric layer, in one embodiment, is formed of silicon oxide. For example, the second gate dielectric layer is formed of thermal silicon oxide. Other types of gate dielectric materials may also be useful. The second gate dielectric layer, for example, is a thick gate dielectric layer.

A buried doped region 170 may be provided in the substrate within the first device doped well. As shown, the buried doped region surrounds a lower portion of the trench in which the gate is formed. For example, the buried doped region surrounds the lower portion of the lower gate electrode and second gate dielectric layer. The buried doped region serves as a drift well in the substrate. In one embodiment, the buried doped region is a first polarity type buried well. The trench transistor, as described, is compatible with current CMOS processes.

Figure 3B:
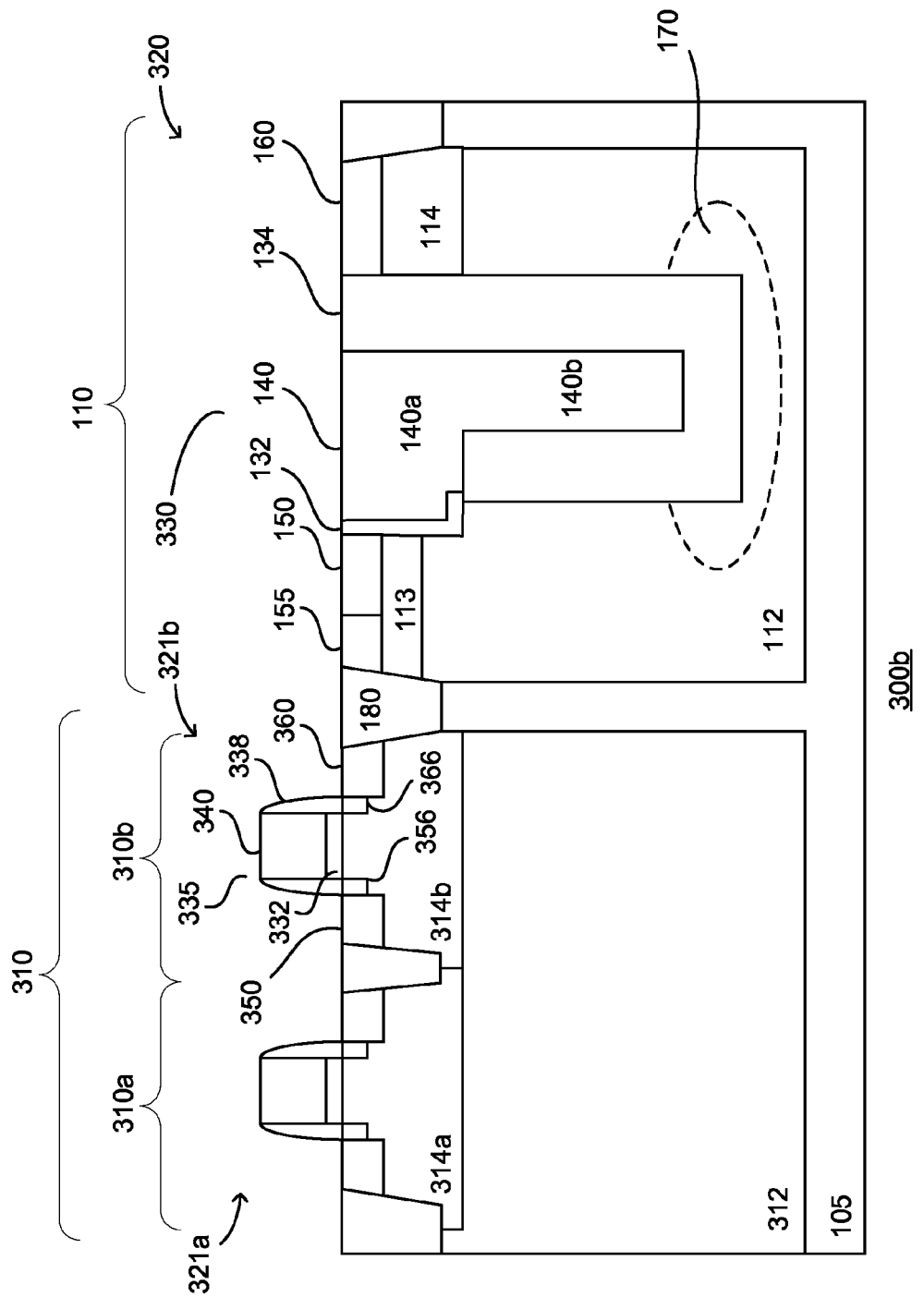

FIG. 3b shows a cross-sectional view of another embodiment of a device 300b. A semiconductor substrate 105 is provided. The substrate includes first and second device regions 110 and 310. The first device region is a HV device region and the second region is a low voltage (LV) device region. Although only HV and LV device regions are shown, it is understood that the device may include other device regions, for example, intermediate/medium voltage (MV) device region.

In one embodiment, the HV device region includes a trench transistor 320. The trench transistor, for example, is similar to that described in FIG. 3a. As such, common elements may not be described or described in detail. For example, the HV device region includes a first or HV deep device doped well 112. The first deep device doped well, in one embodiment, is a first polarity type doped well. The trench transistor includes a gate 330 with a source region 150 and drain region 160. The source region is adjacent to a first side of the gate and the drain region is adjacent to a second side of the gate. The components of the trench transistor are disposed in a lateral configuration. The HV device region is isolated from other device regions by, for example, an isolation region 180, such as an STI region.

The LV device region is isolated from other device regions by an isolation region 180. The isolation region, for example, is a STI region. A LV deep device doped well 312 is provided in the LV device region. In one embodiment, the LV deep device doped well is a second polarity type deep device doped well. The LV deep device well is a lightly doped second polarity type doped well. The LV deep device doped well may have similar characteristics to the deep device doped well in the HV device region except that it is of the opposite polarity type. Providing LV and HV deep device wells having different characteristics may also be useful. The LV device region may be isolated by, for example, an STI region.

In other embodiments, the LV deep device doped well may be provided by an appropriately doped substrate. For example, in the case where the substrate is an appropriately doped substrate, a separate LV deep device well may not be needed. In the case where the LV deep device well is a $p^-$ doped well, it may be provided by a $p^-$ doped substrate.

As shown, the LV device region includes first and second transistor regions 310a-b. The first and second transistor regions include first and second transistor wells 314a-b for first and second transistors 321a-b. The transistor wells, for example, are intermediate doped wells. The transistor wells serve as bodies of the transistors. In one embodiment, the transistors are LV transistors.

A transistor includes a gate 335 having a gate electrode 340 and a gate dielectric 332. The gate dielectric, for example, is a thin gate dielectric for LV transistors. The gate dielectric may be a thermal silicon oxide with a thickness of about 1-200 Å. Other types of gate dielectric materials or thicknesses may also be useful. As for the gate electrode, it may be formed of polysilicon. Providing other types of gate electrode materials may also be useful. The gate electrode may have a thickness of about 500-5000 Å. Other gate electrode thicknesses may also be useful. A transistor includes first and second source/drain (S/D) regions 350 and 360 adjacent to first and second sides of the gate. The S/D regions are heavily doped regions.

Gate dielectric sidewall spacers 338 may be included on the gate sidewalls. The spacers, for example, include silicon nitride. Other types of materials may also be used. For example, the spacers may be a silicon nitride or multiple layers of dielectric materials, such as silicon oxide and silicon nitride. The sidewall spacers are employed, for example, to form lightly doped drain (LDD) regions 356 and 366. A channel of the transistor is located in the substrate under the gate between the S/D regions.

In one embodiment, the first and second transistors are opposite polarity type transistors. For example, the first transistor is a first polarity type transistor and the second transistor is a second polarity type transistor. The first type may be n-type and the second type may be p-type. For example, n-type transistors include n-type S/D regions and p-type transistor wells while p-type transistors include p-type S/D regions and n-type transistor wells. The S/D regions may be similar to the source and drain regions of the HV transistor while the transistor wells may be similar to the second device doped well of the HV transistor.

Contacts may be formed on the contact regions of the device. The contact regions include, for example, source, drain, S/D and body bias regions as well as gate electrodes. In one embodiment, the contacts may be silicide contacts. Providing other types of contacts may also be useful.

A dielectric layer (not shown) may be disposed over the substrate. It is understood that there may be additional layers between the dielectric layer and the substrate, such as for example, an etch stop layer. The dielectric layer serves as an interlevel dielectric (ILD) layer. The dielectric layer may be, for example, silicon oxide. Other types of dielectric materials, such as doped $SiO_2$, Boron-doped Phophosilicate Glass (BPSG) or BorophosphosilicateTetraethylorthosilicate Glass (BPTEOS), may also be useful for the ILD layer.

Interconnects (not shown), which include contacts and conductive lines, are provided in the ILD layer. The device may include multiple interconnect levels. The interconnects, for example, provide connections to the silicide contacts of the device.

Figure 4A:
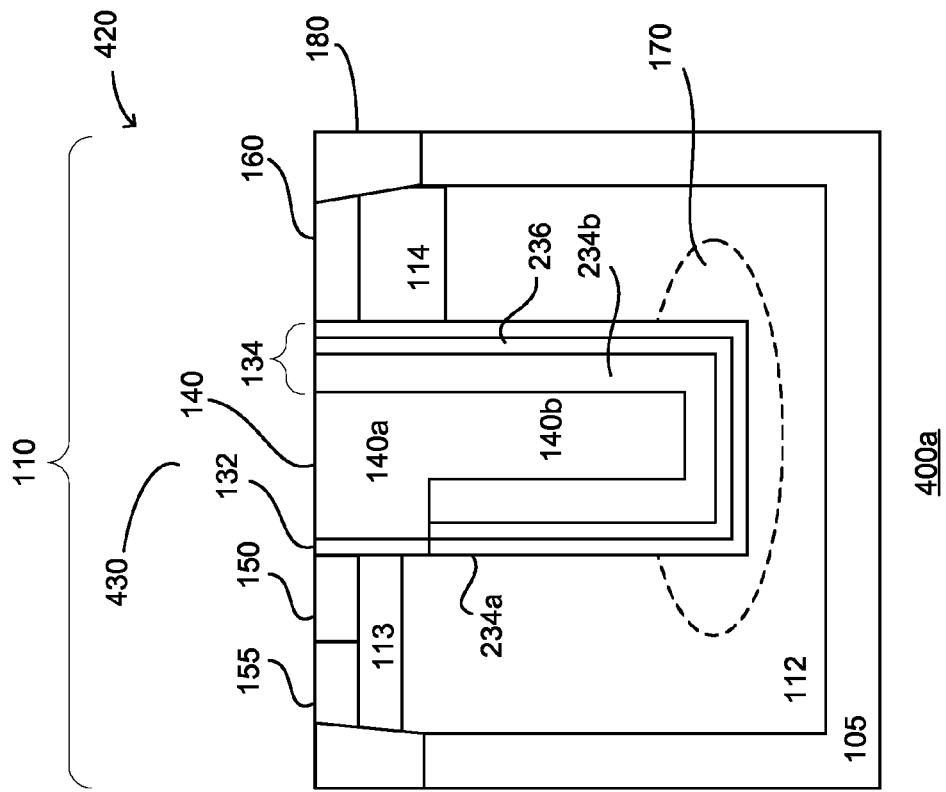

FIG. 4a shows a cross-sectional view of another embodiment of a device 400a. The device is similar to the device shown in FIG. 2. As such, common elements may not be described or described in detail. The device includes a trench transistor 420 disposed in a device region 110 of a substrate 105. The components of the trench transistor are disposed in a lateral configuration. The device region includes a first deep device doped well 112. The deep device doped well is a first polarity type doped well.

An isolation region 180 may be provided to isolate the device region from other device regions on the substrate. The transistor includes a gate 430, a source region 150 and a drain region 160. The source region is adjacent to a first side of the gate and the drain region is adjacent to second side of the gate.

The gate is disposed in a trench formed in the substrate. The gate includes a gate electrode 140 with upper and lower gate electrodes 140a-b. In one embodiment, the upper gate electrode is wider than the lower gate electrode. As shown, the outer edges of the upper and lower gate electrodes are aligned while the inner edge of the lower gate electrode is recessed from the inner edge of the upper gate electrode.

The gate includes a first dielectric and second dielectric layers 132 and 134. The first gate dielectric layer lines the inner edge of the upper gate electrode and the second gate dielectric layer 134 lines the lower gate electrode and the outer edge of the upper gate electrode. In one embodiment, the second gate dielectric layer is a multi-layered dielectric stack. The dielectric stack may include a nitride layer 236 sandwiched by first and second oxide layers 234a-b, forming an ONO stack. Other types of dielectric stacks may also be useful. The first gate dielectric layer may be the same as the first oxide layer. The trench transistor is compatible with current CMOS processes.

Figure 4B:
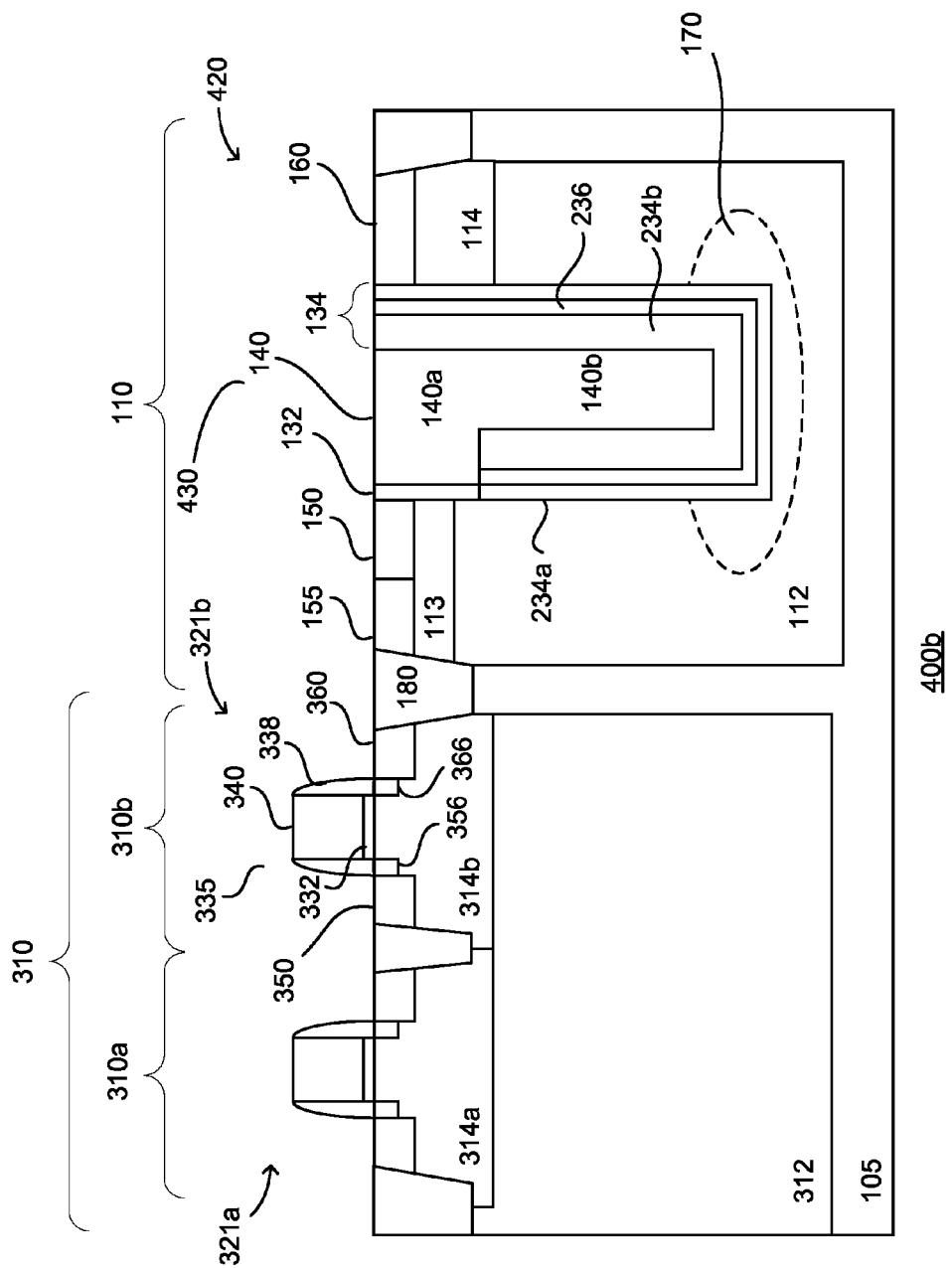

FIG. 4b shows a cross-sectional view of a device 400b with integrated HV and LV devices. A semiconductor substrate 105 is provided. The substrate includes first and second device regions 110 and 310. The first device region is a HV device region and the second region is a low voltage (LV) device region. Although only HV and LV device regions are shown, it is understood that the device may include other device regions. For example, the device includes an intermediate/medium voltage (MV) device region.

In one embodiment, the HV device region includes a trench transistor 420. The trench transistor, for example, is similar to that described in FIG. 4a. As such, common elements may not be described or described in detail. For example, the HV device region includes a first or HV deep device doped well 112. The deep device doped well, in one embodiment, is a first polarity type doped well. The trench transistor includes a gate 430 with a source region 150 and drain region 160. The source region is adjacent to a first side of the gate and the drain region is adjacent to a second side of the gate. The components of the trench transistor are disposed in a lateral configuration. The HV device region is isolated from other device regions by, for example, an isolation region 180, such as an STI region.

The LV device region is isolated from other device regions by an isolation region 180. The LV device region is similar to the LV device region of FIG. 3b. As such, common elements may not be described or described in detail. A LV deep device doped well 312 is provided in the LV device region. In one embodiment, the LV deep device doped well is a first polarity type deep device doped well. First and second transistor regions 310a-b with first and second transistors 321a-b are provided. The transistors, for example, are LV transistors.

Figure 5B:
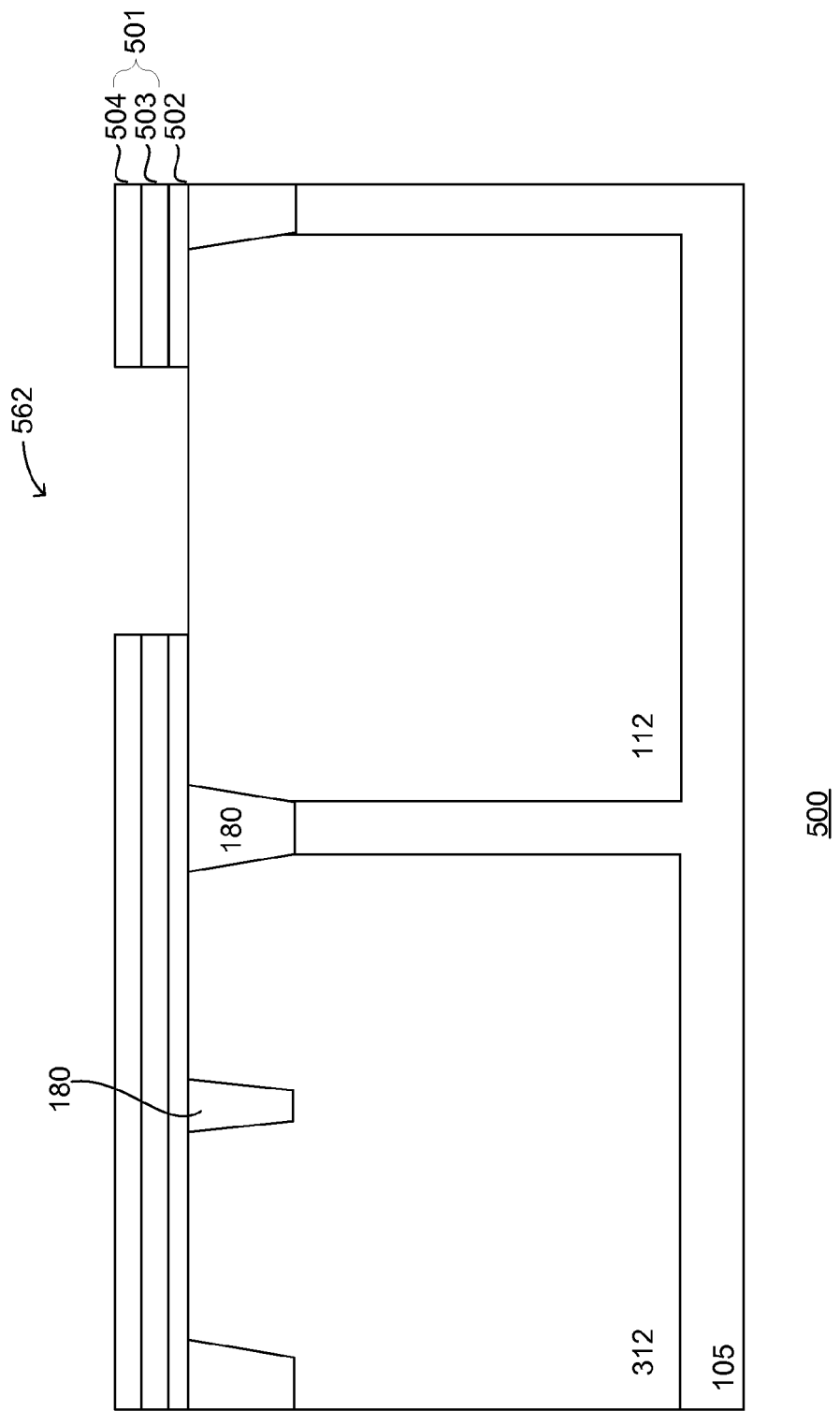
FIGS. 5a-r show cross-sectional views of a process of forming an embodiment of a device.
Figure 5C:
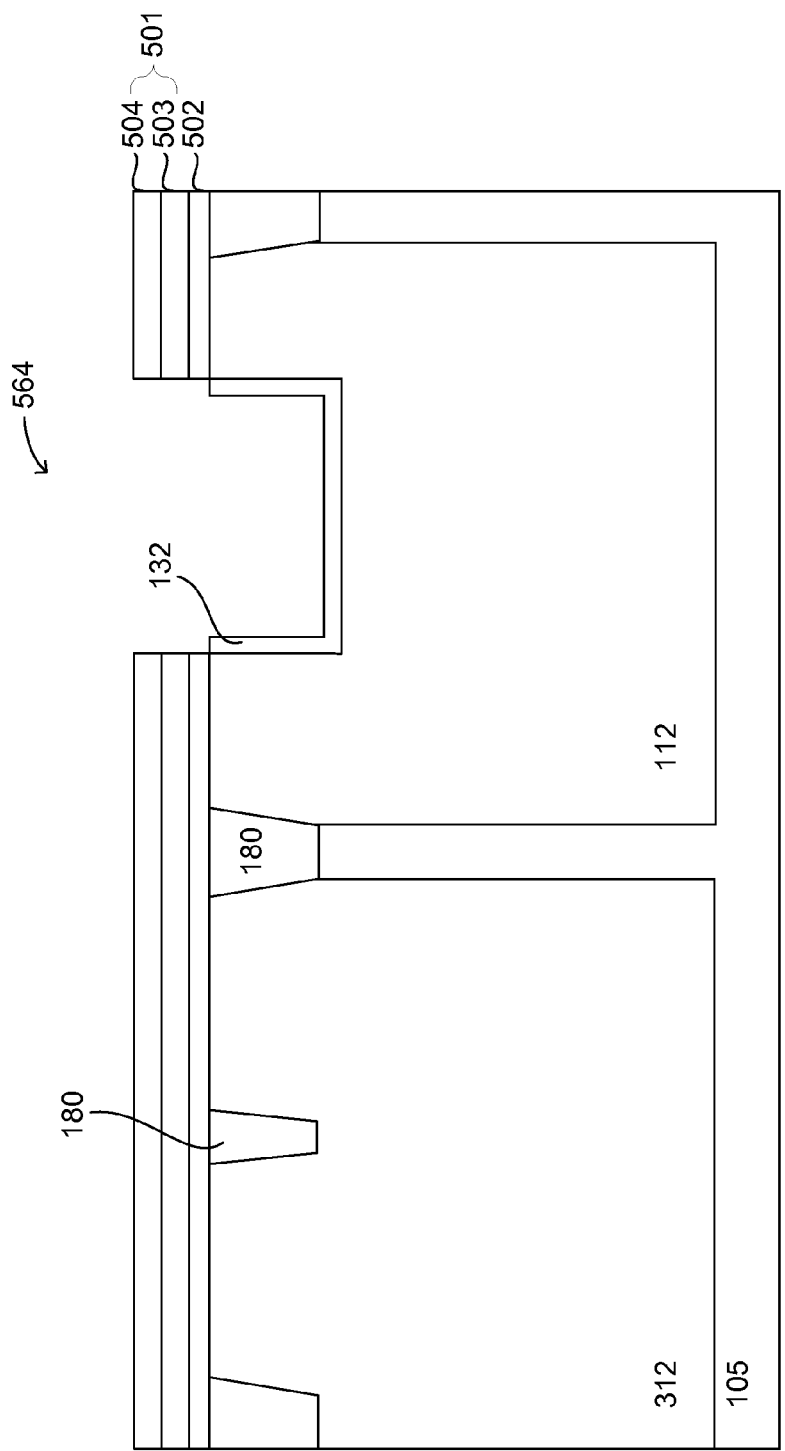
Figure 5D:
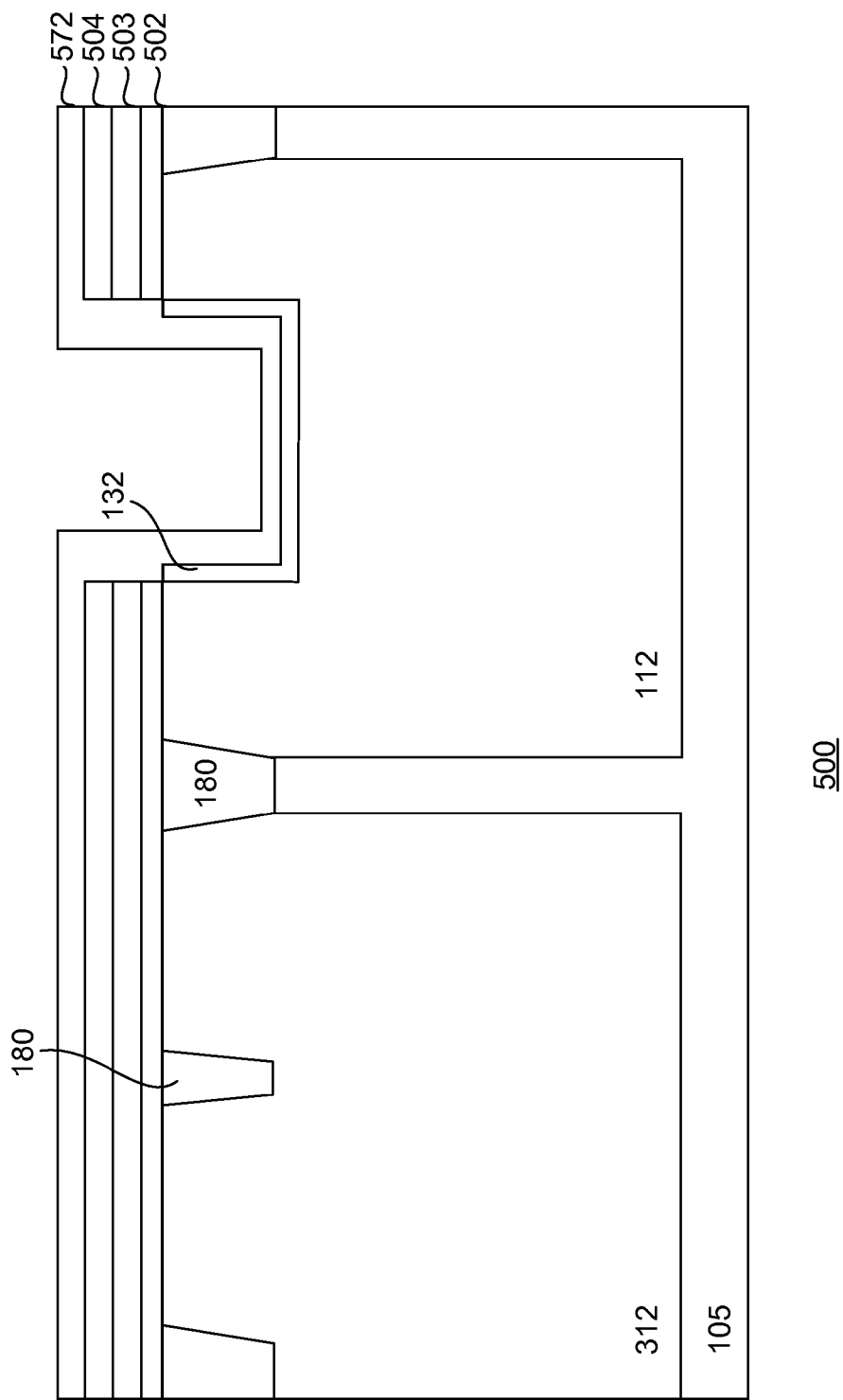
Figure 5E:
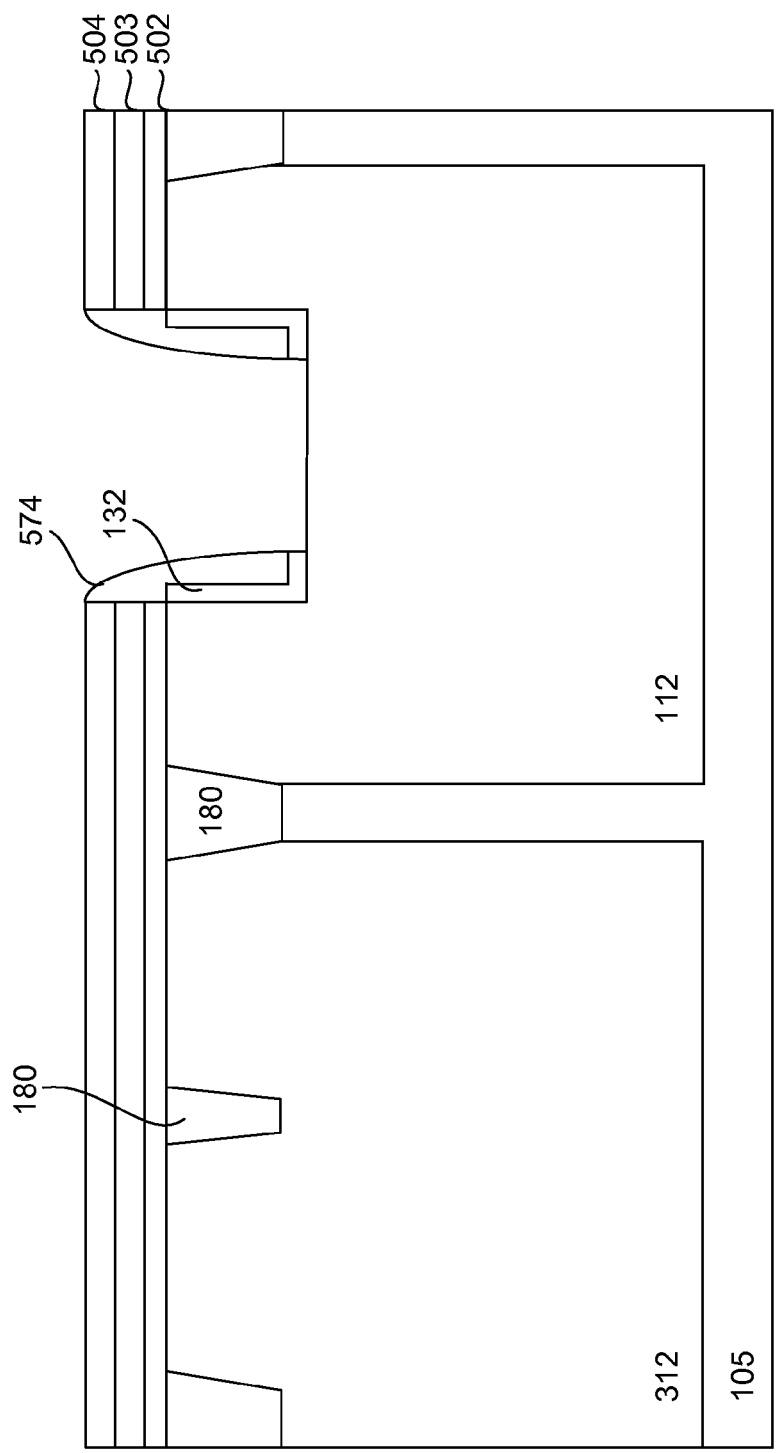
Figure 5F:
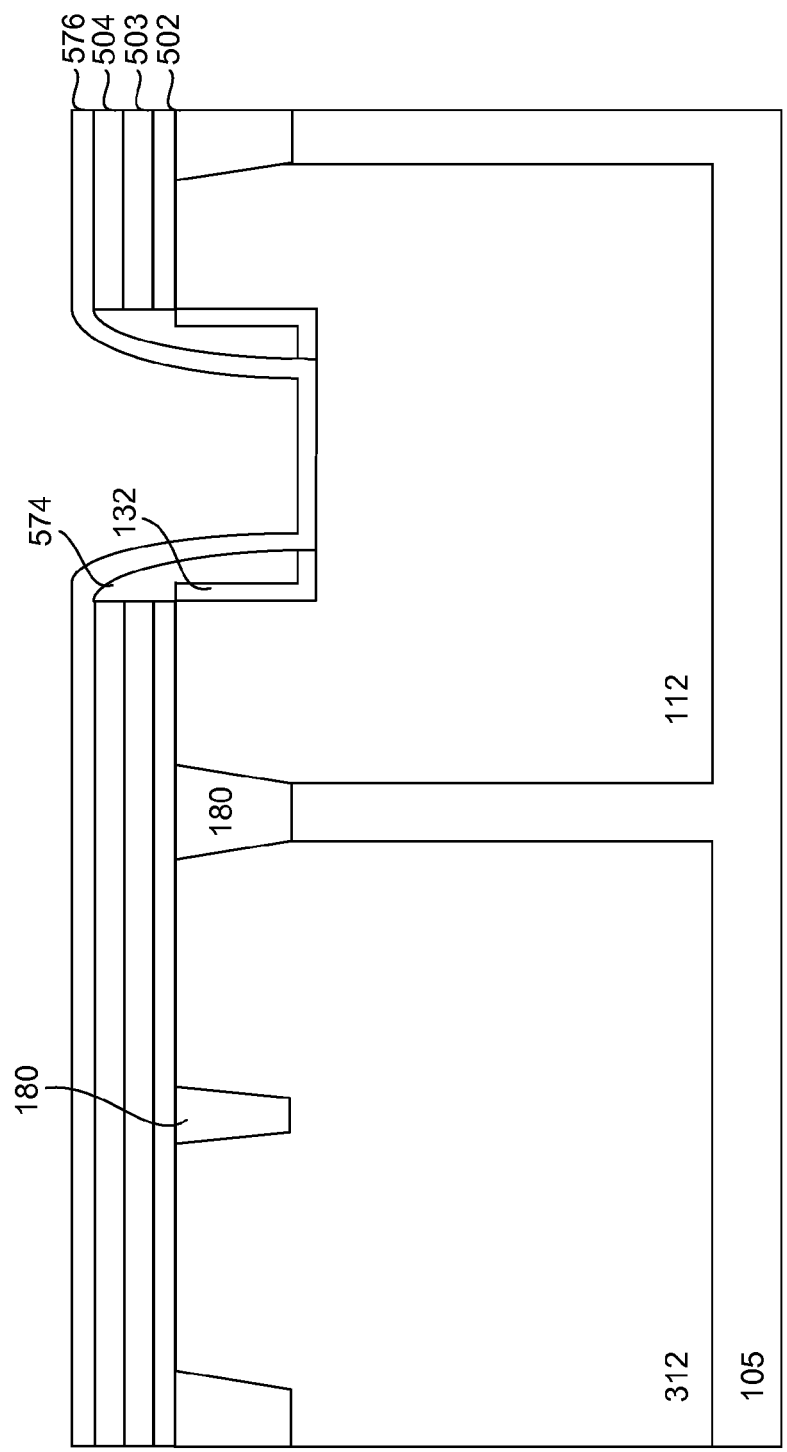
Figure 5G:
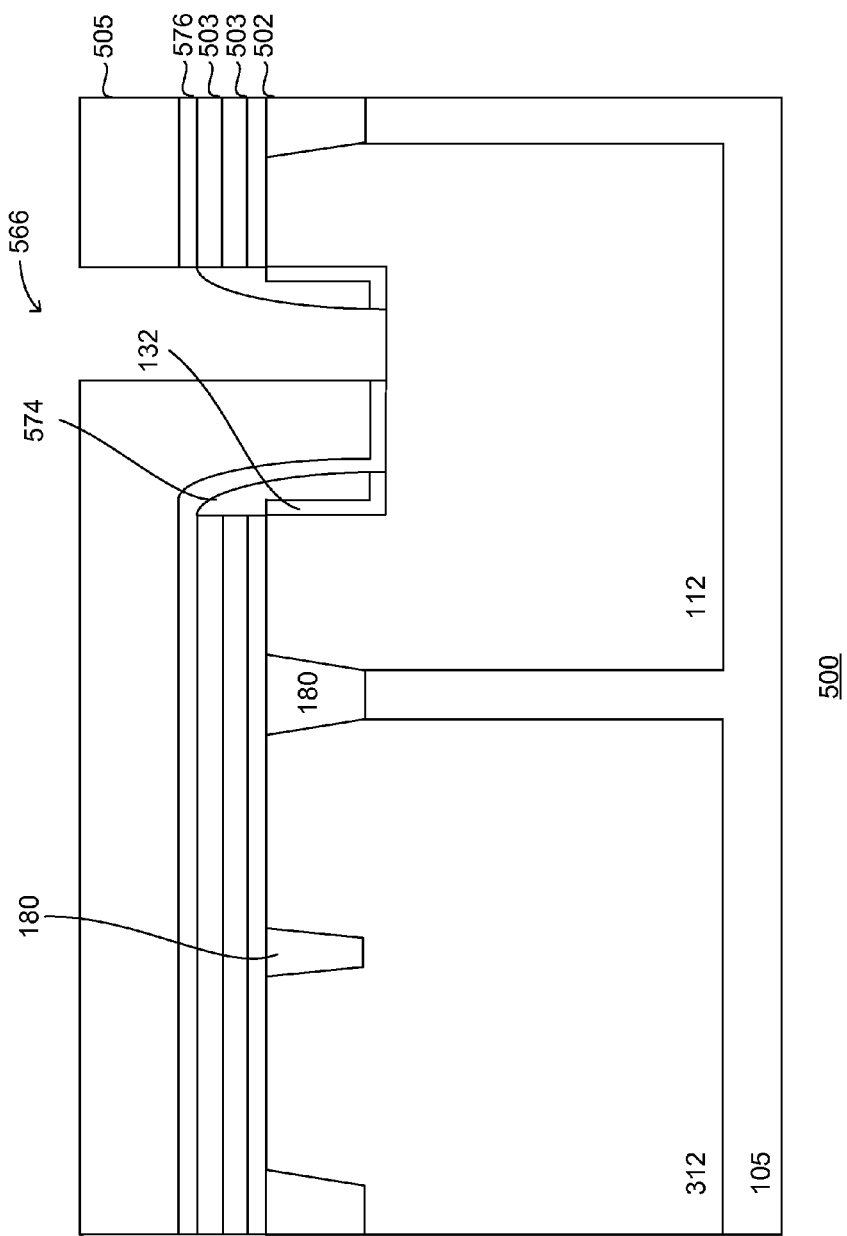
Figure 5H:
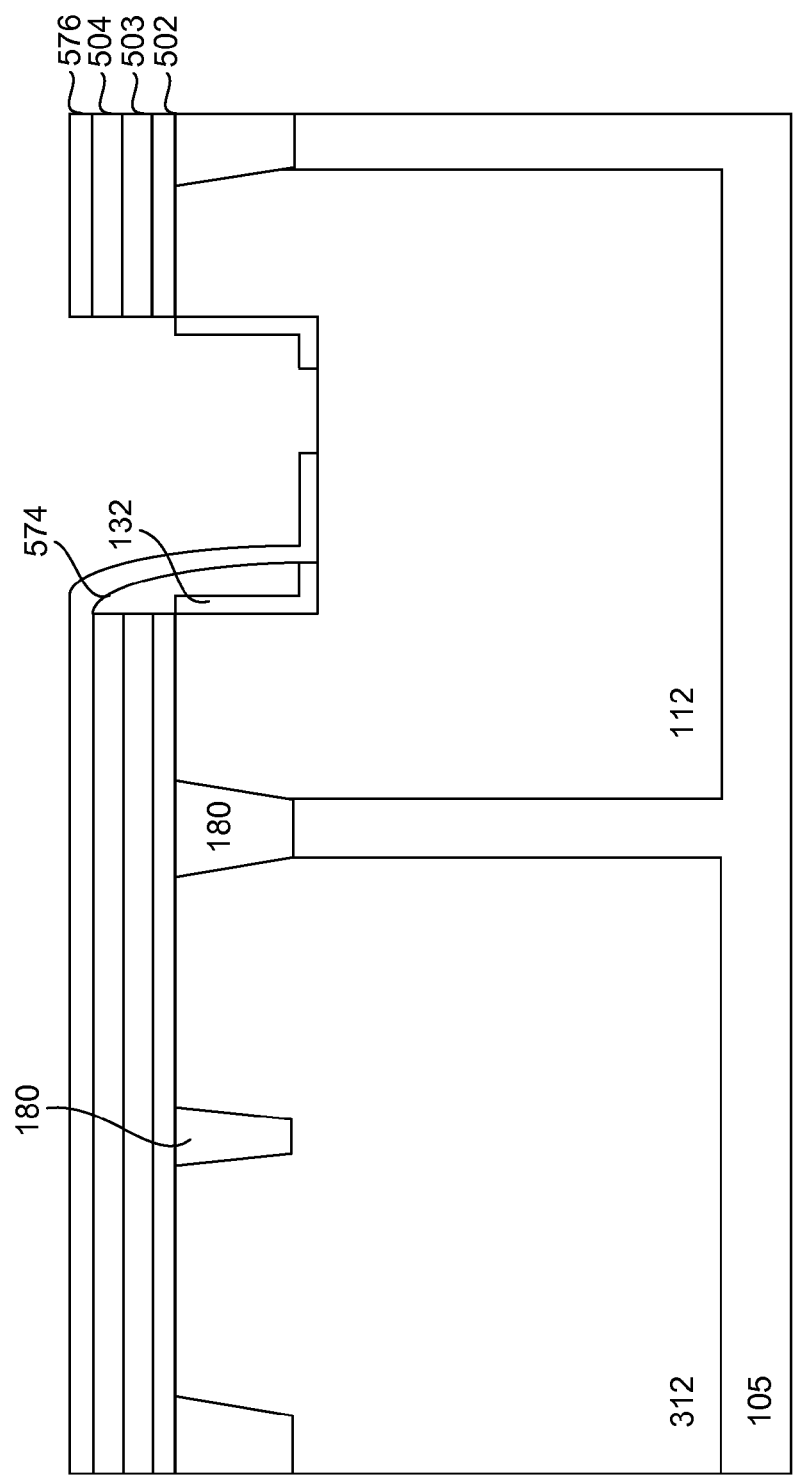
Figure 5I:
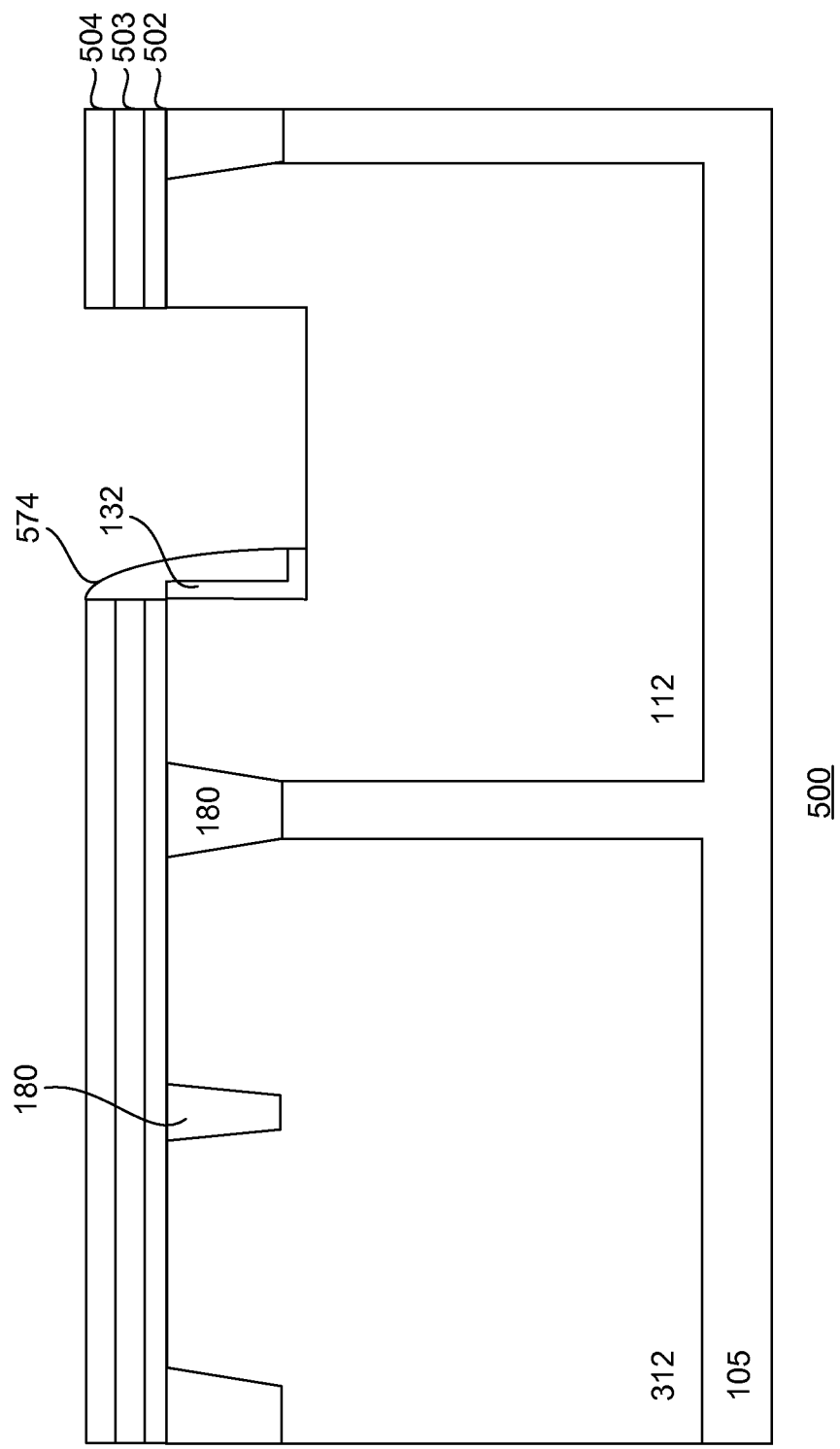
Figure 5J:
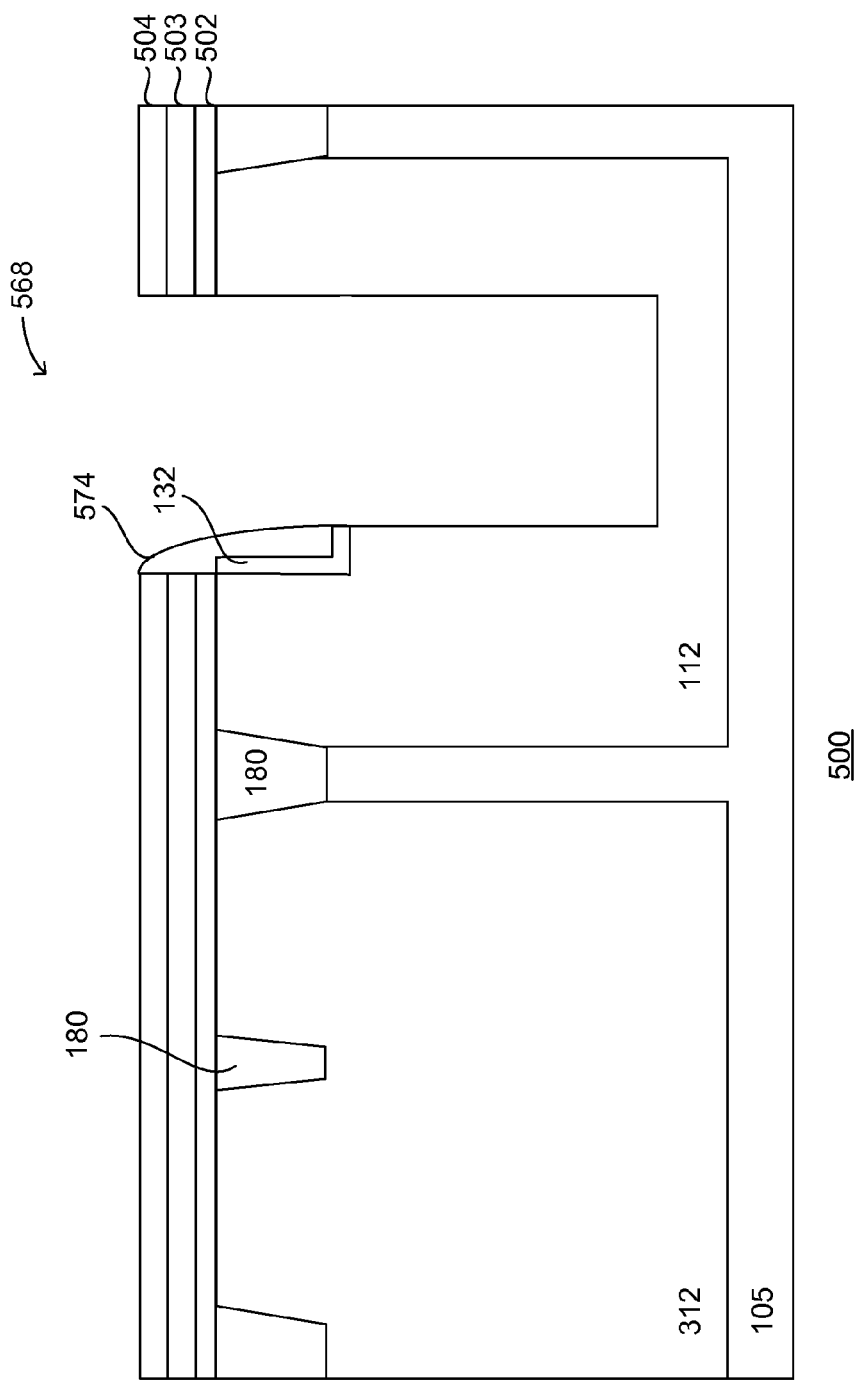
Figure 5K:
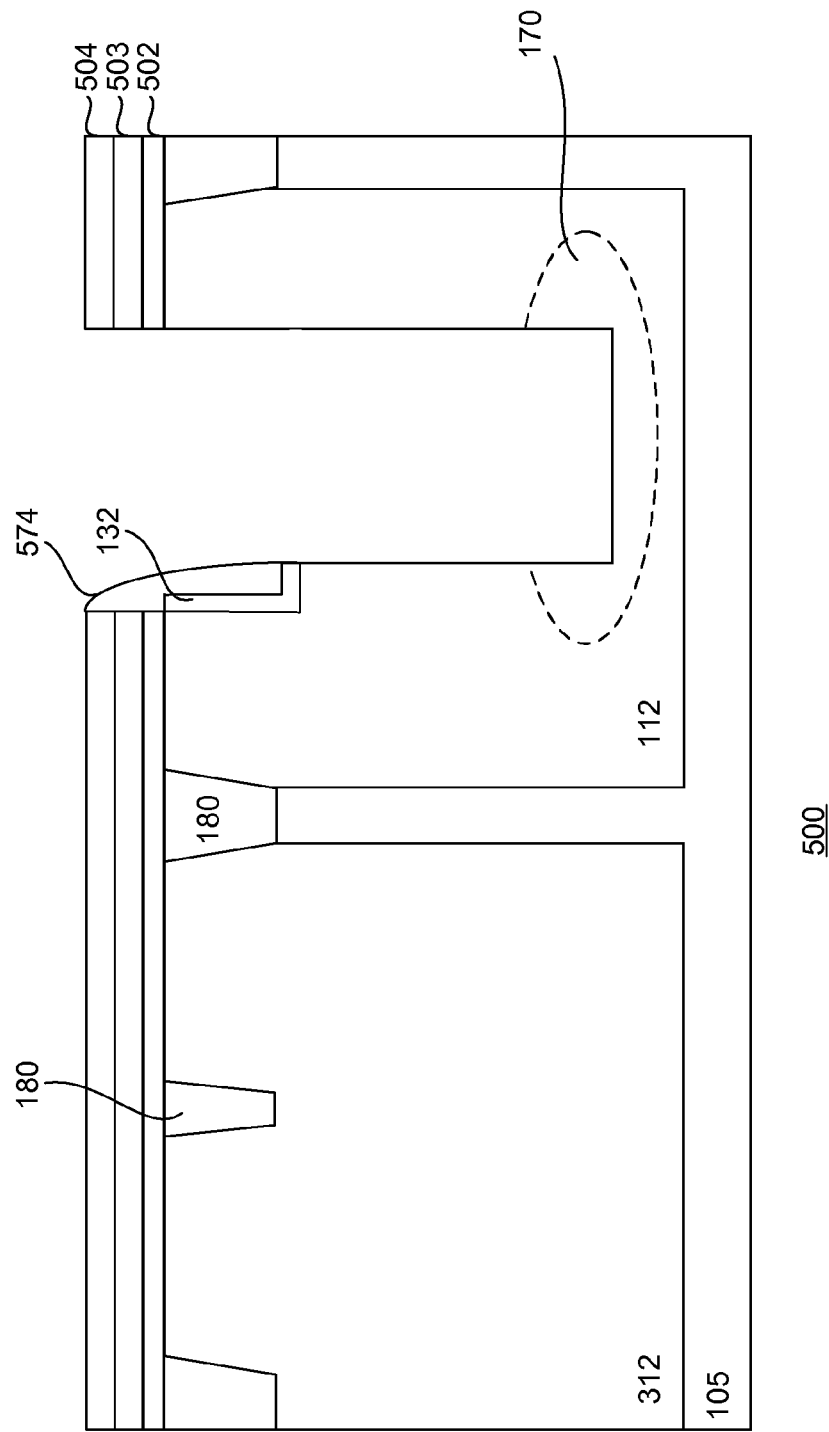
Figure 5I:
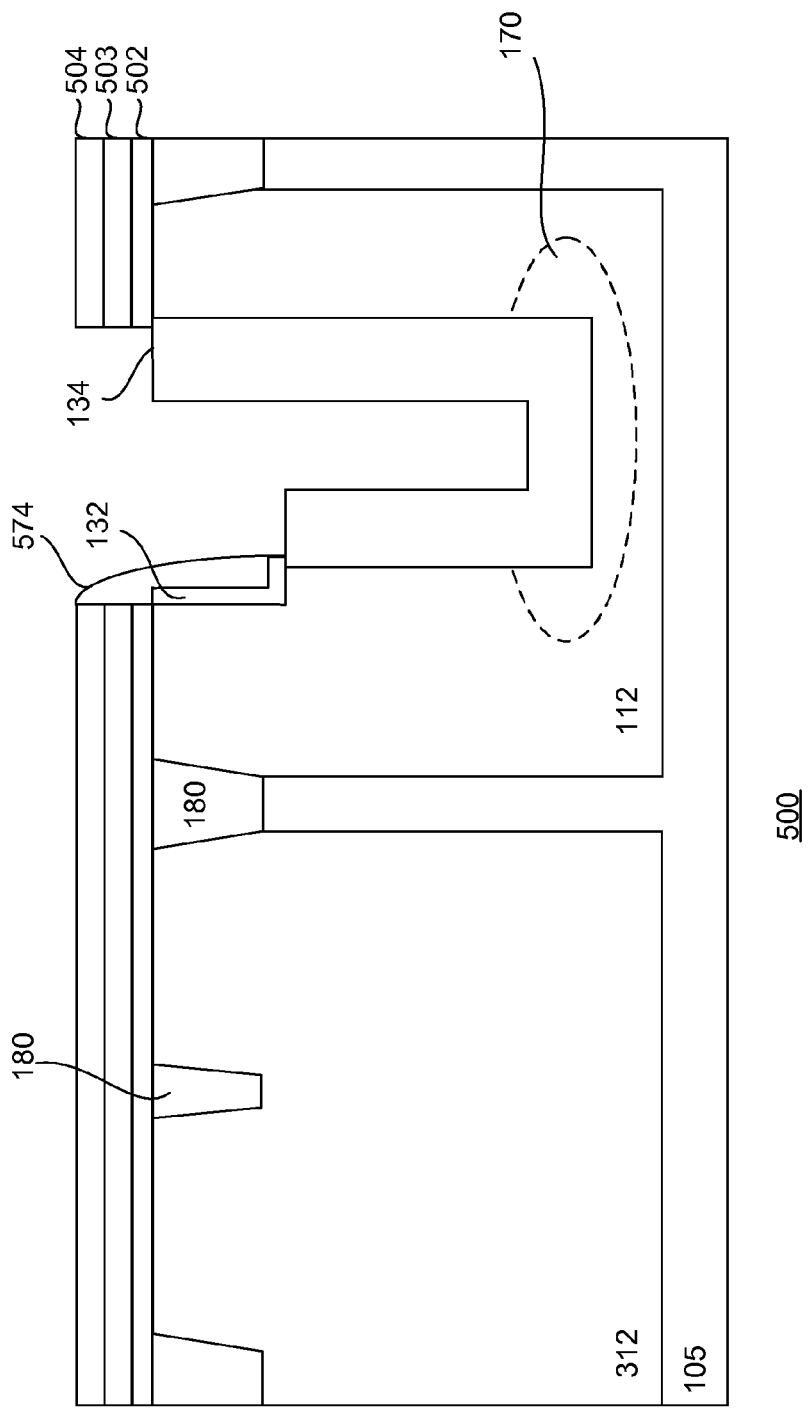
Figure 5M:
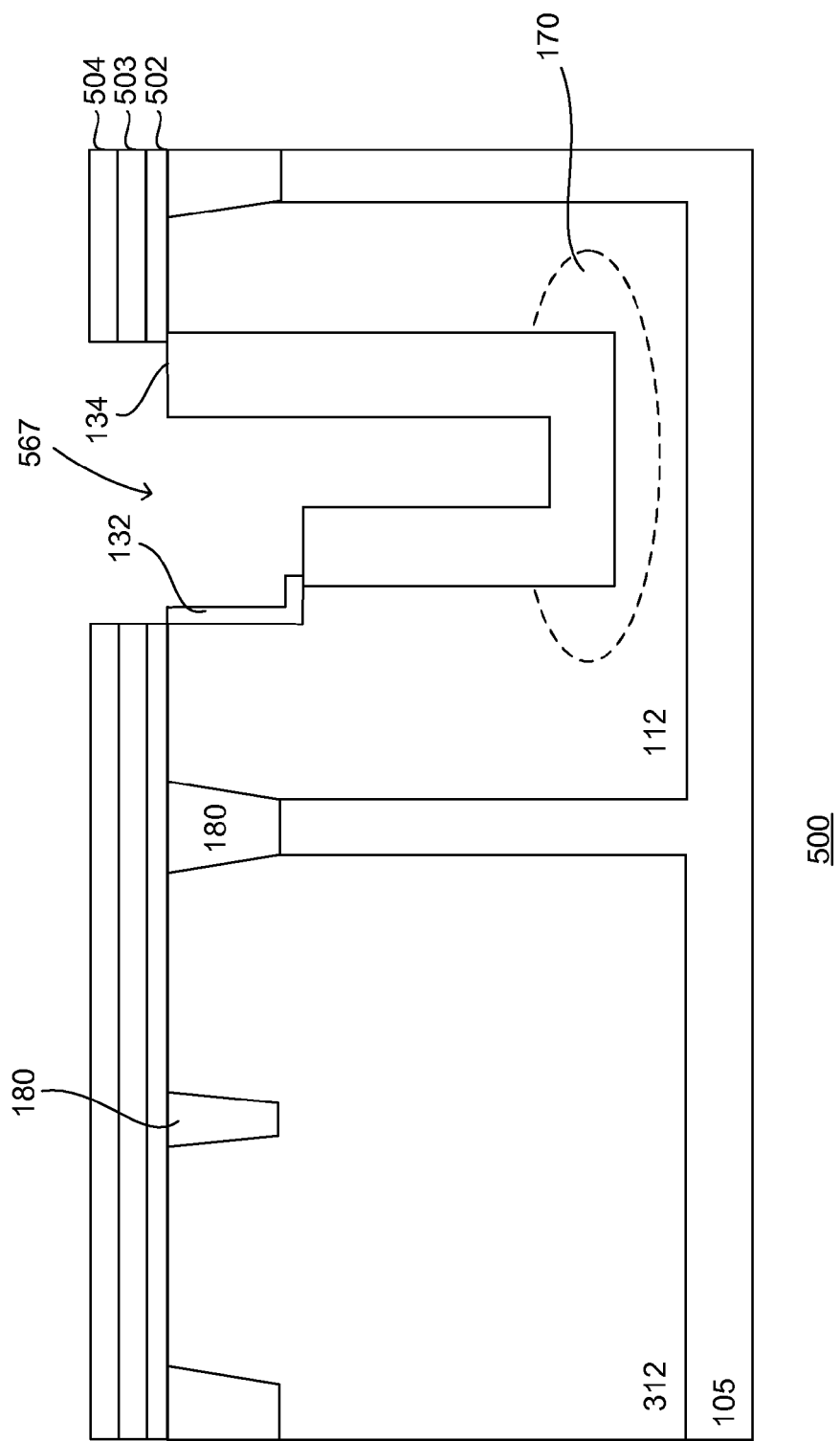
Figure 5N:
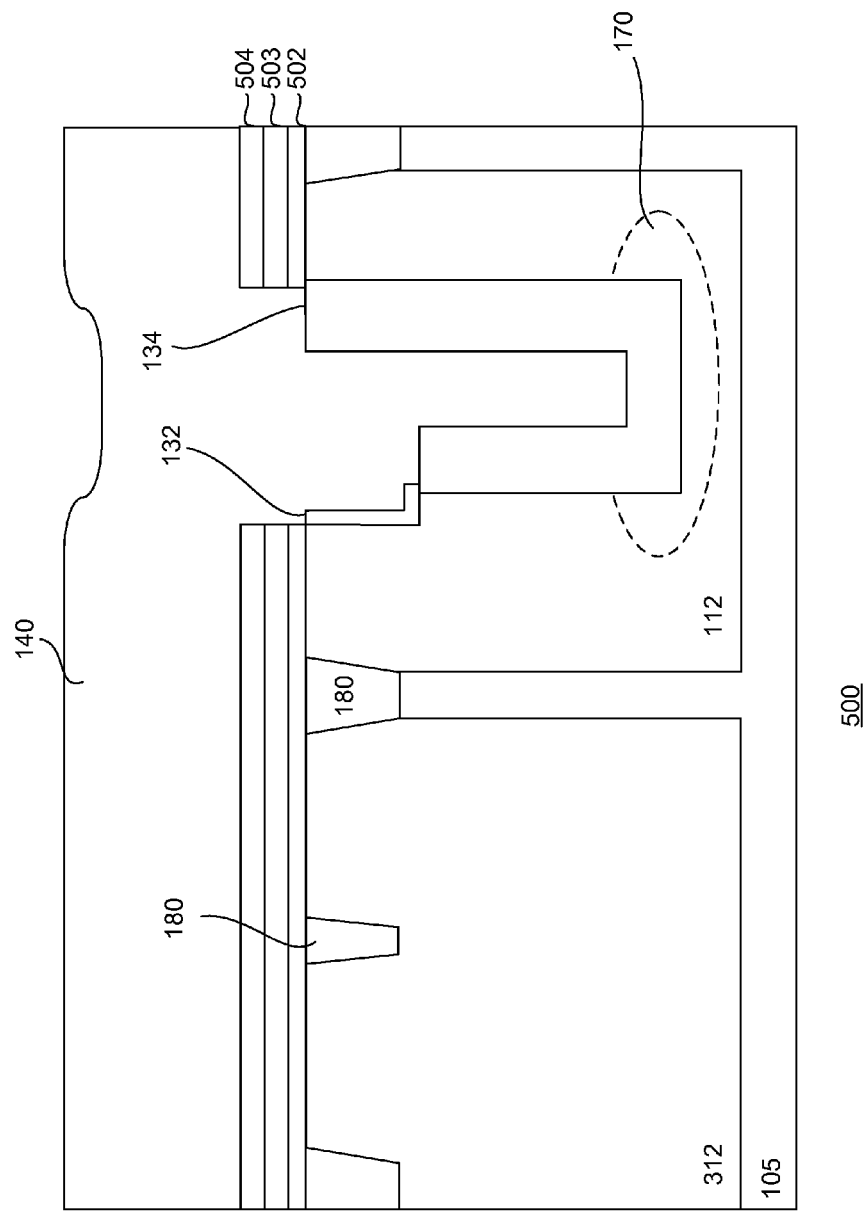
Figure 5O:
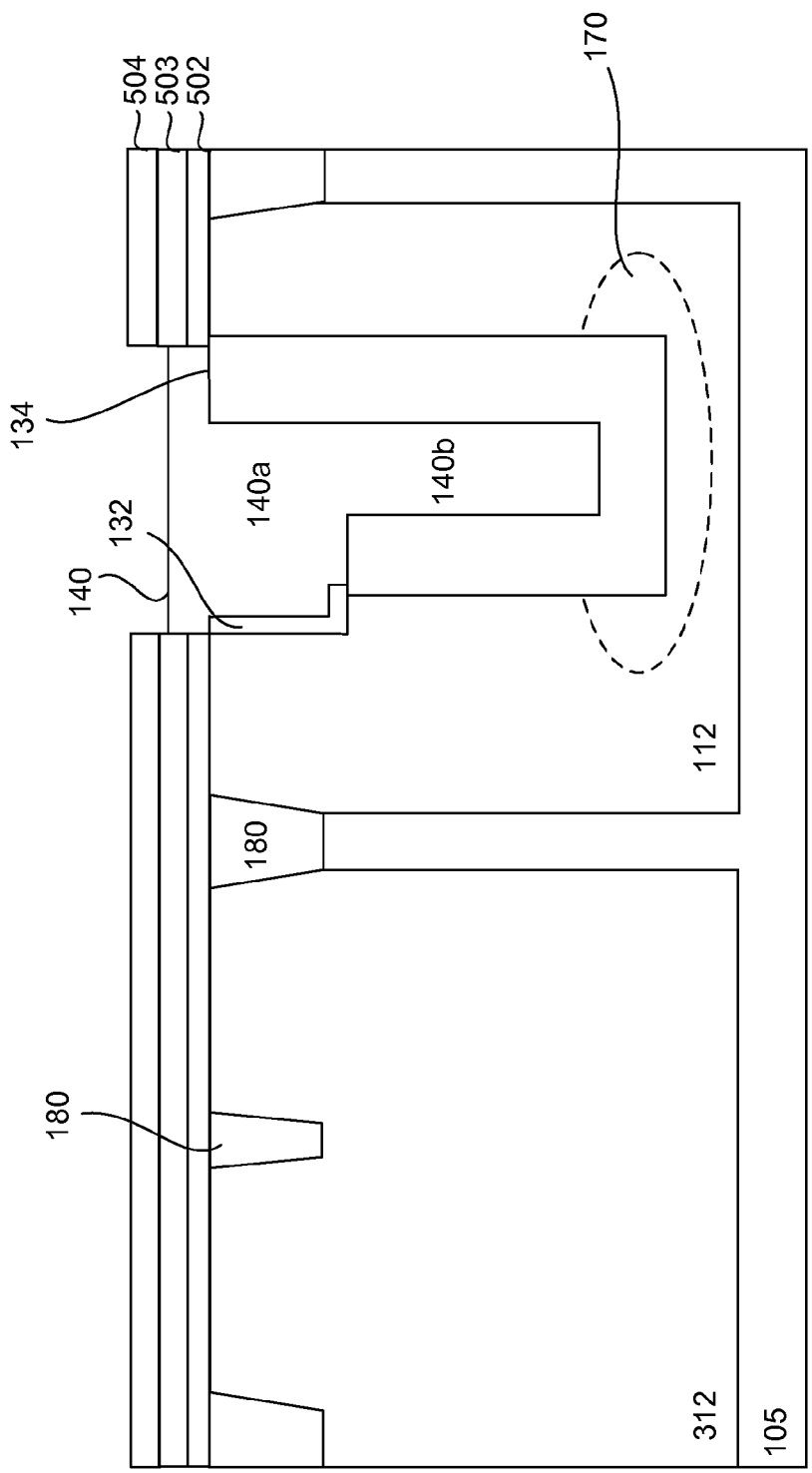
Figure 5P:
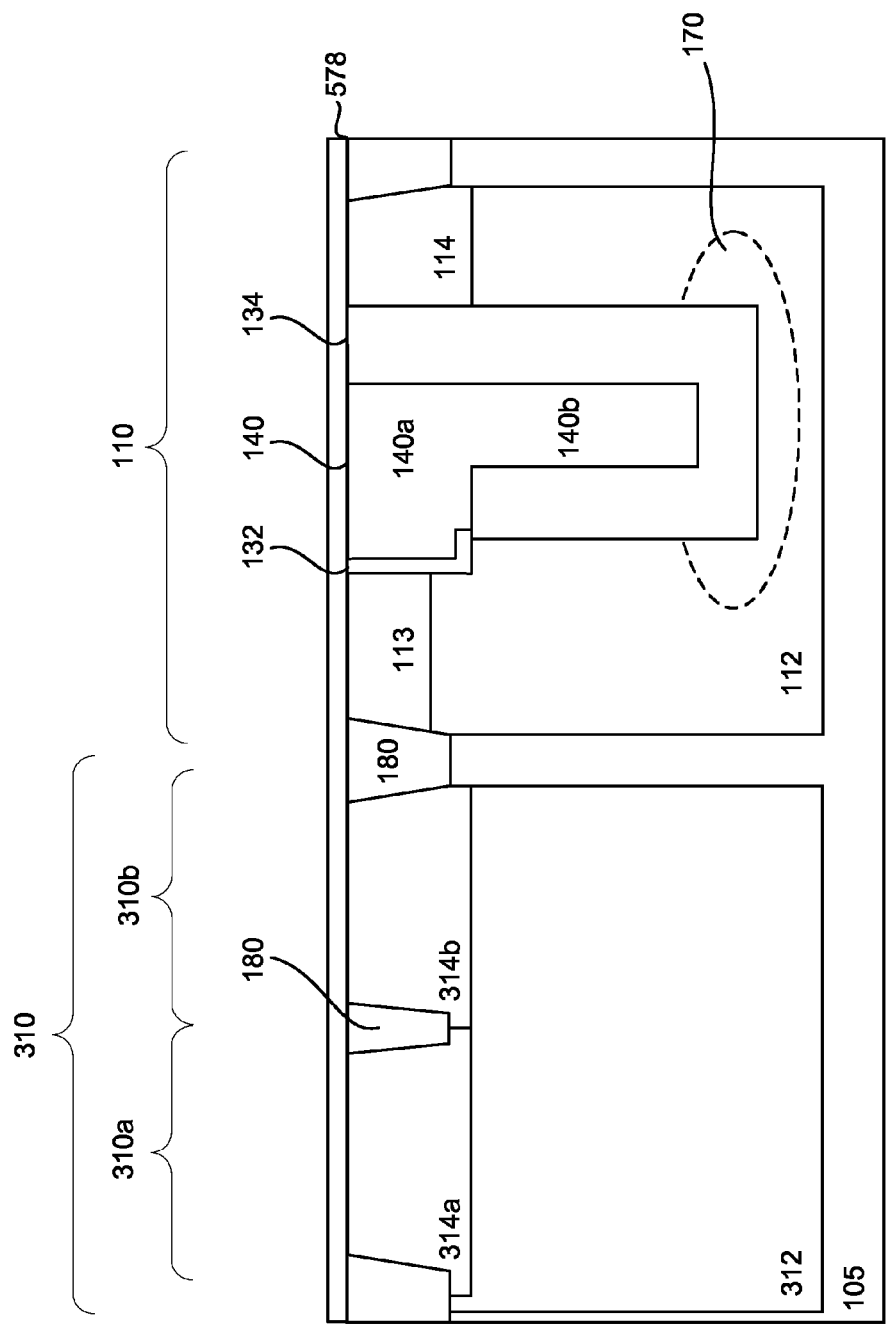
Figure 5Q:
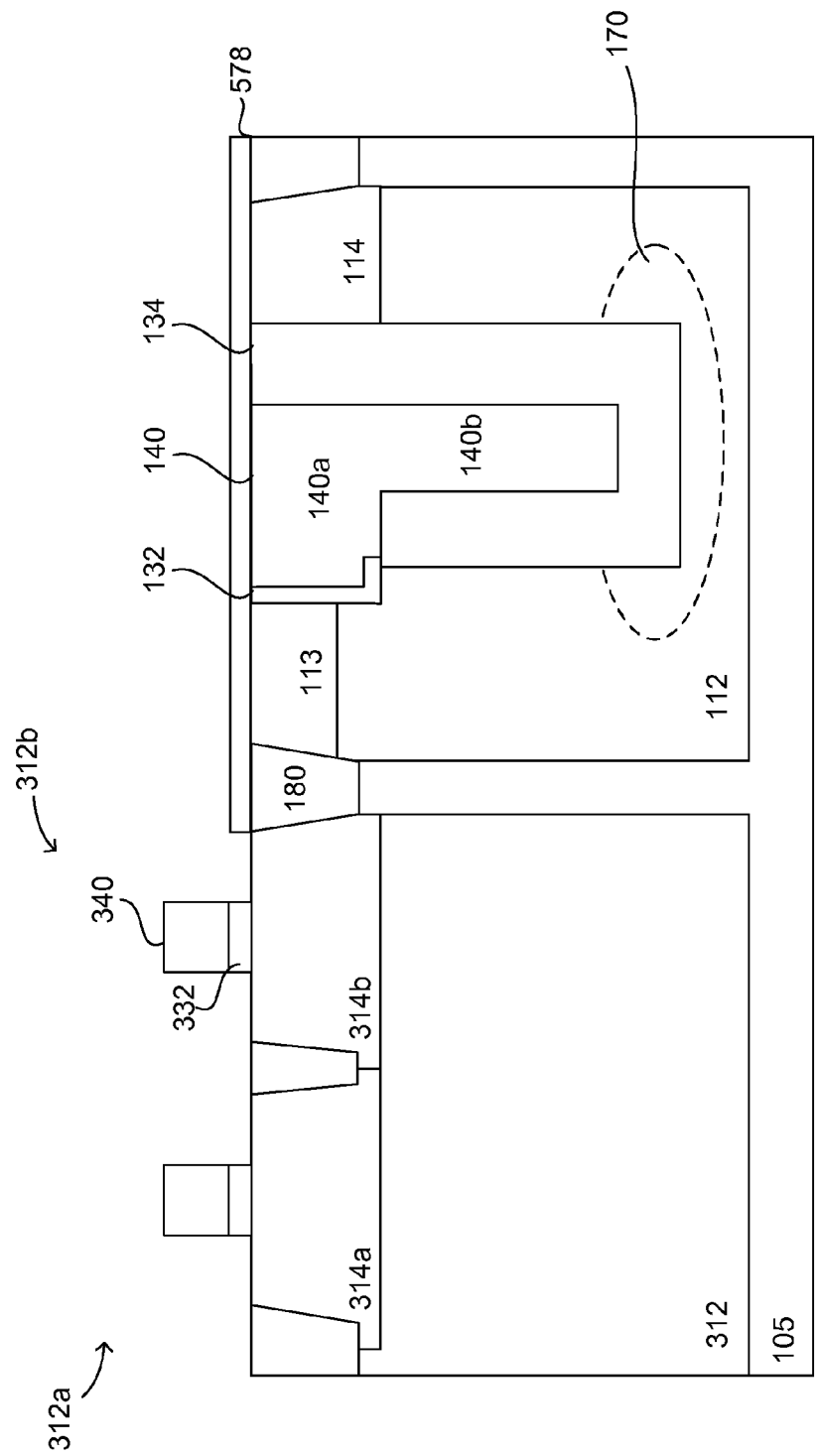
Figure 5R:
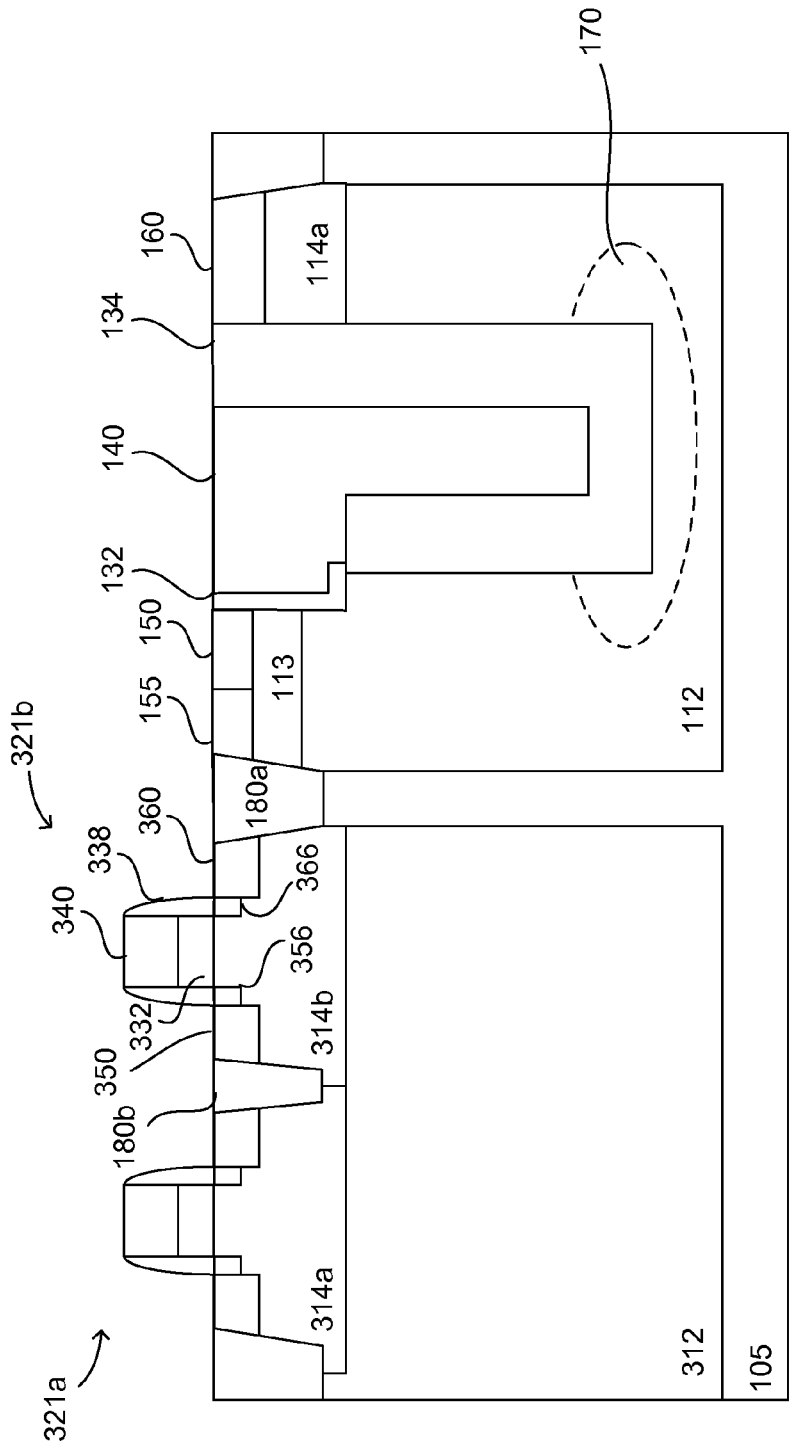

FIGS. 5a-r show cross-sectional views of an embodiment of a process 500 for forming a device or IC. Referring to FIG. 5a, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

As shown in FIG. 5a, a HV device region 110 and a LV device region 310 are defined on the substrate. It is understood that the substrate may include other types of regions. For example, the substrate may include other device regions for other types of devices. Furthermore, it is understood that a region may include additional regions or sub-regions. For example, the LV device region is shown to include first and second sub-regions 310a-b.

A device isolation region 180 may be provided to isolate a device region from other regions. For example, device isolation regions may be provided to isolate the HV and LV device regions and sub-regions. The isolation regions, for example, are shallow trench isolation (STI) regions. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI regions. Other types of isolation regions may also be employed. For example, the isolation region may be a deep trench isolation (DTI) region. The depth of the STI regions may be, for example, about 300-4500 Å. Other depths for the STI regions may also be useful.

A first deep device doped well 112 is provided in the HV device region. The first deep device doped well in the HV device region serves as a drift well for a trench transistor. The depth of the first deep device doped well, for example, may be about 3-5 μm. Providing deep device doped wells of other depths may also be useful. Providing the deep device doped wells of different depths in the HV device region and LV device region may also useful. The first deep device doped well, in one embodiment, is doped with first polarity type dopants for a first polarity type trench transistor. For example, a n-type first device doped well is provided for a n-type trench transistor. Forming a p-type deep device doped well for a p-type trench transistor may also be useful. In one embodiment, the deep device doped wells are lightly doped wells. Other dopant concentrations for the deep device doped wells may also be useful.

The LV device region, maybe provided with a second deep device doped well 312. The second deep device doped well may be a second polarity type deep device doped well. In one embodiment, the second deep device doped well is lightly doped with secondpolarity type dopants. The second deep device doped well may encompass the LV device region, serving as isolation well. In other embodiments, the second deep device well may be provided by the substrate. For example, if the substrate is appropriately doped, no separate LV deep device well needs to be provided. This is because the substrate may serve as the second deep device well.

To form deep device doped wells, an implant mask which exposes the device regions is used. The implant mask, for example, is a photoresist layer which is patterned. The implant mask may be patterned using lithographic techniques. Since the device isolation region can serve as an implant mask, this allows for increased processing window for the patterning process to form the implant mask. Dopants are implanted into the substrate using the implant mask. The dopants are implanted with the appropriate dose and power. In some embodiments, deep device doped wells may be formed by, for example, performing multiple implants at different energies. Separate polarity type deep wells are formed using separate implant processes with separate implant masks.

An anneal is performed. In one embodiment, the anneal is performed after the deep device doped wells are formed. The anneal diffuses the dopants from the implant, forming the deep device doped wells which extend to under the bottom of the device isolation region. In other embodiment, separate anneal may be performed for the deep device doped wells in the HV device and LV device regions. For example, an anneal may be performed for the individual deep device doped wells to obtain different depths of the deep device doped wells.

The isolation regions, for example, may be formed prior to forming the deep device doped wells. In other embodiments, the isolation regions may be formed after forming the deep device doped wells. Other configurations of forming the isolation regions and deep device doped wells may also be useful.

A hard mask 501 is formed on the surface of the substrate. The hard mask is used to pattern the substrate. For example, the hard mask is used to etch a trench in the substrate in which a gate of a trench transistor is disposed. The hard mask, in one embodiment, is a multilayer hard mask stack. In one embodiment, the hard mask includes first and second hard mask layers 503 and 504. Providing a hard mask of a single layer may also be useful. The first hard mask layer 503, for example, is a lower layer and the second hard mask layer 504 is the upper layer of the hard mask stack. The first and second hard mask layers include materials which can be removed selectively to each other. In one embodiment, the first hard mask layer is silicon nitride while the second hard mask layer is silicon oxide. Other types of layers or stack of the hard mask may also be useful. In one embodiment, the hard mask may be about 0.05-1 μm thick. Other thicknesses for the hard mask are also useful. For example, the thickness for the hard mask may be selected based on design requirements. A pad layer 502 may be provided beneath the hard mask. The pad layer, for example, may be silicon oxide. The pad layer may serve to improve adhesion of the hard mask to the substrate. The pad layer, for example, may be about 50-500 Å thick. Other types of hard mask or combination of hard mask and pad layers may also be useful.

Referring to FIG. 5*b*, the hard mask is patterned to form an opening 562. The opening corresponds to a trench in which a gate of a transistor is formed. Patterning of the opening may be achieved using mask and etch techniques. For example, a soft mask, such as photoresist, may be selectively patterned to create an opening to expose a portion of the hard mask corresponding to the opening. An anisotropic etch, such as a reactive ion etch (RIE), may be performed to remove the exposed portions of the hard mask, including the pad layer, to form the opening. This exposes the substrate surface in the opening. To improve lithographic resolution, an anti-reflective coating (ARC) layer can be provided beneath the photoresist. Other techniques for patterning the hard mask may also be useful. After patterning the hard mask, the mask, including the ARC layer may be removed.

Referring to FIG. 5*c*, an upper portion of a trench 564 is formed in the substrate. In one embodiment, the trench is formed by a RIE, using the hard mask as an etch mask. The trench formed has a depth from the surface of the substrate. The depth, for example, may be about 0.5-3 μm below the surface of the substrate. Other depths may also be useful. The depth, for example, is determined by the requirements of operative voltage.

The exposed trench walls may be cleaned. For example, the trench walls are cleaned to remove any surface damage from the RIE etch. In one embodiment, the cleaning of the trench walls is performed by exposure to hydrogen plasma at a temperature in the range from about 200-400° C. for a period of from about 5 to about 60 seconds. Other techniques for cleaning the substrate may also be useful. A thermal process, for example, thermal oxidation is carried out to deposit an oxide layer on the trench walls. The oxide layer is subsequently removed, for example, by wet etch.

A first gate dielectric layer 132 is formed on the exposed trench walls. The first gate dielectric layer, in one embodiment, is silicon oxide. Other types of gate dielectric materials, such as silicon oxynitride, may also be useful. The first gate dielectric layer, in one embodiment, is formed by thermal process, such as thermal oxidation. For example, the first gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the first gate dielectric layer may be formed by a partial wet oxidation. The thermal process selectively forms the first gate dielectric layer on the exposed trench walls. Other techniques for forming the first gate dielectric layer may also be useful. The thickness of the first gate dielectric layer may be about 100-1000 Å. Other thicknesses for the first gate dielectric layer may also be useful.

As shown in FIG. 5d, a spacer layer 572 is formed on the substrate, covering the hard mask and lining the trench. For example, the spacer layer covers the hard mask and lines the first gate dielectric layer in the trench. The spacer layer, for example, is a silicon nitride layer. Other types of materials which can be selectively removed with respect to the first gate dielectric layer may also be useful. The thickness of the spacer layer is equal to about a thickness of spacers used to facilitate forming the lower portion of the trench. The thickness, for example, may be about 500-5000 Å. Other thicknesses for the spacer layer may also be useful. The spacer layer, for example, may be formed by chemical vapor deposition (CVD). Other techniques for forming the protective layer may also be useful.

Referring to FIG. 5e, the spacer layer is processed to form spacers 574 on the trench sidewalls. An anisotropic etch, such as a reactive ion etch (RIE) may be employed to form the spacers. The RIE removes horizontal portions of the spacer layer, leaving non-horizontal portions remaining as spacers on sidewalls of the trench. As shown, the etch also removes portions of the first gate dielectric lining a bottom of the trench.

As shown in FIG. 5f, a liner layer 576 is formed on the substrate, covering the hard mask, the sidewall spacers and the exposed bottom surface of the trench. The liner layer, for example, serves to protect the spacer layer on the trench sidewalls. The liner layer, for example, is silicon oxide. Other types of liner materials may also be useful. The liner layer, for example, may be formed by CVD. Other techniques for forming the liner layer may also be useful. The thickness of the liner layer may be about 50-5000 Å. Other thicknesses for the liner layer may also be useful.

Referring to FIG. 5g, a soft mask 505 is formed on the substrate. The soft mask, as shown, is selectively patterned to create an opening 566. The soft mask protects the spacer on one of the trench sidewalls while exposing spacers on the other sidewalls. In one embodiment, the soft mask protects the spacer on the source side of the trench. For example, the soft mask protects the spacer on the sidewall of the trench adjacent to the source of the trench transistor while the other spacers are exposed. The soft mask, for example, is formed of a photoresist.

The liner layer in the opening exposed by the patterned soft mask is removed. This exposes the spacers unprotected by the soft mask. Removal of the liner layer, for example, may be achieved by an isotropic etch, such as a wet etch. The etch, for example, selectively removes the liner material. Other techniques for removing the liner layer, such as RIE, may also be useful.

In one embodiment, after removal of the portions of the liner layer unprotected by the soft mask, the soft mask is removed. The soft mask, for example, may be removed by wet etch. Other techniques for removing the soft mask may also be useful. After the removal of the soft mask, the exposed spacers are removed, as shown in FIG. 5h. In one embodiment, the exposed spacers are removed by a wet etch. For example, the spacers are removed by a wet etch using a chemistry which selectively removes the spacer material. Other techniques for removing the spacers may also be useful.

As shown in FIG. 5i, the liner layer and exposed portions of the first gate dielectric layer line the trench walls and bottom are removed, for example, by wet etch. The wet etch, for example, selectively removes the liner layer. In the case where the liner layer and first gate dielectric layer, the etch selectively removes both the liner layer and exposed portions of the first gate dielectric layer. If they are of different materials, a separate etch process may be employed. This leaves a spacer on the sidewall adjacent to the source, exposing remaining portions of the trench.

The substrate is etched, for example, by an RIE using the spacer and the hard mask as an etch mask. The etch forms a lower portion of the trench 568 in the substrate, as shown in FIG. 5j. The depth of the trench, for example, is about 1-10 μm from the surface of the substrate. Other depths of the trench may also be useful. The depth, for example, is determined by the requirement of the operative voltage. In one embodiment, the depth of the trench is shallower than the depth of the HV deep device doped well. For example, the trench is substantially disposed with the HV deep device doped well.

The exposed trench sidewalls, for example, are cleaned. For example, the trench sidewalls are cleaned to remove any surface damage from the RIE etch. In one embodiment, the cleaning of the trench sidewalls is performed by exposure to hydrogen plasma at a temperature in the range from about 200-400° C. for a period of from about 5 to about 60 seconds. Other techniques for cleaning the substrate may also be useful. A thermal process, for example, thermal oxidation is carried out to deposit an oxide layer on the trench sidewalls. The oxide layer is subsequently removed, for example, by wet etch.

Dopants are implanted into the substrate. In one embodiment, first polarity type dopants are implanted into the substrate. The implant forms a doped region at the bottom of the trench, using the spacers and hard mask as an implant mask. An anneal is performed to diffuse and activate the dopants to form a buried doped region 170 as shown in FIG. 5k. The buried doped region, in one embodiment, surrounds the bottom of the trench. The buried doped region serves as a drift well of the device. In one embodiment, the buried doped region is an intermediate doped region with first polarity type dopants. For example, the buried doped region may be a n doped region for a n-type device. The dopant concentration, for example, may be from about $5E13-5E15/cm^3$. Forming a buried doped region with other dopant concentrations may also be useful. The implant energy can be carried out at energy in the range of, for example, approximately 30-60 KeV. The implant dose can be, for example, in the range of about $E13/cm^2$. Other implant energies and/or doses may be used to form the buried doped region.

Referring to FIG. 5l, a second gate dielectric layer 134 is formed on the exposed portion of the trench sidewalls. The second gate dielectric layer is selectively formed on the exposed portions of the trench sidewalls. The second gate dielectric layer, in one embodiment, is silicon oxide. Other types of gate dielectric materials, such as silicon oxynitride, may also be useful. The second gate dielectric layer, in one embodiment, is formed by thermal process, such as thermal oxidation. For example, the second gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the second gate dielectric layer may be formed by a partial wet oxidation. The thermal process selectively forms the second gate dielectric layer on the exposed trench sidewalls. Other techniques for forming the second gate dielectric layer may also be useful. The thickness of the second gate dielectric layer may be about 0.05-1 μm. Other thicknesses for the second gate dielectric layer may also be useful.

In one embodiment, the second gate dielectric layer lines the exposed portion of the trench sidewalls and bottom, leaving a gap 567 in the trench. The gap corresponds to a trench in which a gate electrode of a transistor is formed. The gap includes an upper and a lower portion. In one embodiment, the lower portion of the gap is narrower than the upper portion of the gap. For example, outer edges of the upper portion and the lower portion may be aligned while opposing or inner edge of the lower portion is recessed from an inner edge of the upper portion. The spacer is removed to expose the first gate dielectric layer, as shown in FIG. 5m. In one embodiment, the spacer is removed using a wet etch. The wet etch selectively removes the spacer, leaving the first gate dielectric layer remaining.

Referring to FIG. 5n, a gate electrode layer 140 is formed on the substrate. The gate electrode layer fills the upper and lower portions of the trench and covers the substrate. The filled upper portion of the trench forms an upper gate electrode 140a while the filled lower portion of the trench forms a lower gate electrode 140b. The upper gate electrode serves as a gate electrode and the lower gate electrode serves as a gate field plate. In one embodiment, the first and second gate dielectric layers surround the gate electrode layer in the trench. The gate electrode layer, in one embodiment, is polysilicon. Other types of gate electrode material may also be useful. For example, the gate electrode layer may be formed of tungsten. The gate electrode layer may be formed by CVD. Other techniques of forming the gate electrode layer may also be useful.

Referring to FIG. 5o, a planarization process is performed to remove excess material of the gate electrode layer. In one embodiment, the planarization process includes a polishing process, such as chemical mechanical polishing (CMP). Alternatively, the excess material of the gate electrode layer is removed by an etch back process. Other types of planarization processes may also be useful to remove the excess gate electrode material. In one embodiment, an over-polish is performed to recess the top surface of the gate electrode layer below the surface of the hard mask. In one embodiment, top surface of the gate electrode is recessed below a top surface of the first hard mask layer.

In FIG. 5p, the hard mask is removed. In one embodiment, the hard mask is removed by, for example, a wet etch. Other techniques for removing the hard mask may also useful.

A screen oxide layer 578 may be formed on the surface of the substrate. The screen oxide layer serves as an implant screen for ion implantations to form the doped wells in the substrate. Various ion implants are performed to form first and second transistor wells 314a-b in the LV device region and second and third device doped wells 114 and 113 in the HV device region. The first transistor well in the LV device region is a first polarity type well, the second transistor well in the LV device region is a second polarity type well, the second doped well in the HV device region is a first polarity type well and the third device doped well in the HV device region is a second polarity type well.

The first transistor well is disposed in the first transistor region 310a and the second transistor well is disposed in the second transistor region 310b. In one embodiment, the transistor wells are disposed below the isolation region and serve as bodies of subsequently formed first and second transistors in the LV device region. A depth of the transistor wells, for example, may be about 0.1-0.3 μm. Other depths may also be useful. As shown, the wells abut each other. Providing non-abutting wells may also be useful.

As for the second doped well, it is disposed adjacent to the drain side of the trench while the third doped well is disposed adjacent to the source side of the trench. In one embodiment, the second doped well has a bottom below the isolation region and the third doped well has a bottom above the bottom of the isolation region. The depth of the second doped well may be about 0.1-0.3 μm; the depth of the third doped well may be about 0.1-0.3 μm. Other depths may also be useful.

As shown in FIG. 5q, the process continues to form gates of transistors in the LV device region. In one embodiment, the screen oxide layer in the LV device region is removed to expose the surface of the substrate. For example, a mask, such as a photoresist, is provided to protect the HV device region, leaving the LV device region exposed. An etch, such as a wet etch, removes the screen oxide layer in the LV device region. The etch, for example, is a wet etch. Other techniques may also be used to remove the screen oxide in the LV device region.

The mask is removed, for example, by wet etch. Other techniques for removing the mask may also be useful. For example, the mask may be removed by ashing. After the removal of the mask, the gate layers are formed on the substrate. For example, gate dielectric and gate electrode layers are formed on the substrate, covering the exposed surface of the substrate in the LV device region and the screen oxide on the HV device region.

The gate dielectric layer 332, in one embodiment, is silicon oxide. Other types of gate dielectric materials, such as silicon oxynitride, may also be useful. The gate dielectric layer, in one embodiment, is formed by thermal process, such as thermal oxidation. For example, the gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the gate dielectric layer may be formed by a partial wet oxidation. The thermal process selectively forms the gate dielectric layer on the exposed surface of the substrate. Other techniques for forming the gate dielectric layer may also be useful. The thickness of the gate dielectric layer is about that used for LV transistors. For example, the thickness of the gate dielectric layer may be about 100-1000 Å. Other thicknesses for the gate dielectric layer may also be useful.

The gate electrode layer 340, for example, is polysilicon. The thickness of the gate electrode layer, for example, maybe about 500-5000 Å. Other types of gate electrode layers, thicknesses or techniques for forming the gate electrode layer may also be useful. For example, the gate electrode layer may be TaN, TiN, WSix or other types of gate electrode material or may be formed by techniques such as atomic layered deposition (ALD) or sputtering. The gate electrode layer may be doped to reduce resistance, adjust $V_T$, adjust work function or a combination thereof. The type of dopants and dopant concentration may be appropriately selected based on the design requirements. The gate electrode layer may be in situ doped during formation or doped by ion implantation after the formation of the gate electrode layer.

The gate dielectric and the gate electrode layers are patterned to form gate stacks of first and second transistors 312a-b on the transistor regions. Mask and etch techniques may be employed to form the gate stacks. For example, a patterned photoresist mask may be used as an etch mask for a RIE to form the gate stacks. Other techniques for patterning the gate dielectric layer and the gate electrode layer may also be useful. After forming the gate stacks, the mask layer is removed.

In one embodiment, as shown in FIG. 5r, LDD regions 356 and 366 are formed in the in the LV device region. For example, first type LDD regions are formed in the first LV transistor sub-region and second type LDD regions are formed in the second LV transistor sub-region. Implant masks, such as photoresist, may be used to facilitate forming the LDD regions. Separate implant processes are performed to form the different LDD regions. The process parameters of the implantation, such as dose and energy, may be appropriately selected based on design requirements. An implant mask may be removed after each implant process by, for example, ashing.

The process continues, for example, to form spacers 388 on sidewalls of the gates of the LV transistors. The spacers, for example, are silicon nitride spacers. Other types of gate spacer materials may also be useful. To form the spacers, a spacer layer is deposited on the substrate. The spacer layer can be formed by using various techniques, such as plasma enhanced chemical vapor deposition (PECVD). Other techniques to form the spacer layer or forming other types of sidewall spacers may also be useful. The spacer layer is anisotropically etched, such as by RIE, to remove horizontal portions, leaving non-horizontal portions on the sidewalls of the gates as the spacers. In one embodiment, the etch to form the spacer is selective to the screen oxide and substrate. This, for example, exposes the substrate surface in the LV region and the screen oxide in the HV device region.

Doped contact regions of the transistors in the LV and HV device regions are formed. The doped contact regions include S/D regions 350 and 360 of the LV transistors and the source and drain regions 150 and 160 of the trench transistor, as well as the body bias contact region 155 are formed in the substrate. The doped contact regions are heavily doped contact regions. The doped contact regions are formed by implant processes.

In one embodiment, the doped contact regions of the transistors in the LV and HV device regions have the same parameters, except polarity type.

In one embodiment, the doped contact regions of the first transistor and source and drain contact regions of the trench transistor have the same parameters. As such, these doped contact regions can be formed using the same implant process. The doped contact regions of the second transistor and the body bias contact region of the trench transistor have the same parameters. As such, these doped contact regions can be formed using the same implant process.

An implant process is performed with an implant mask. The implant mask, for example, may be a patterned photoresist layer. The implant mask exposes the portion of the substrate which dopants are implanted. Different implant processes are performed using, for example, different implant masks and appropriate implant parameters.

The process continues to forming the device. For example, metal silicide contacts may be formed on the contact regions, such as the doped contact regions and gates of the transistors. Additional processes may be performed to complete the device. For example, interconnect metal levels may be provided to form interconnections to the terminals of the transistor and other circuit components, as desired. Other processes may include, for example, final passivation, dicing, packaging and testing.

Figure 6A:
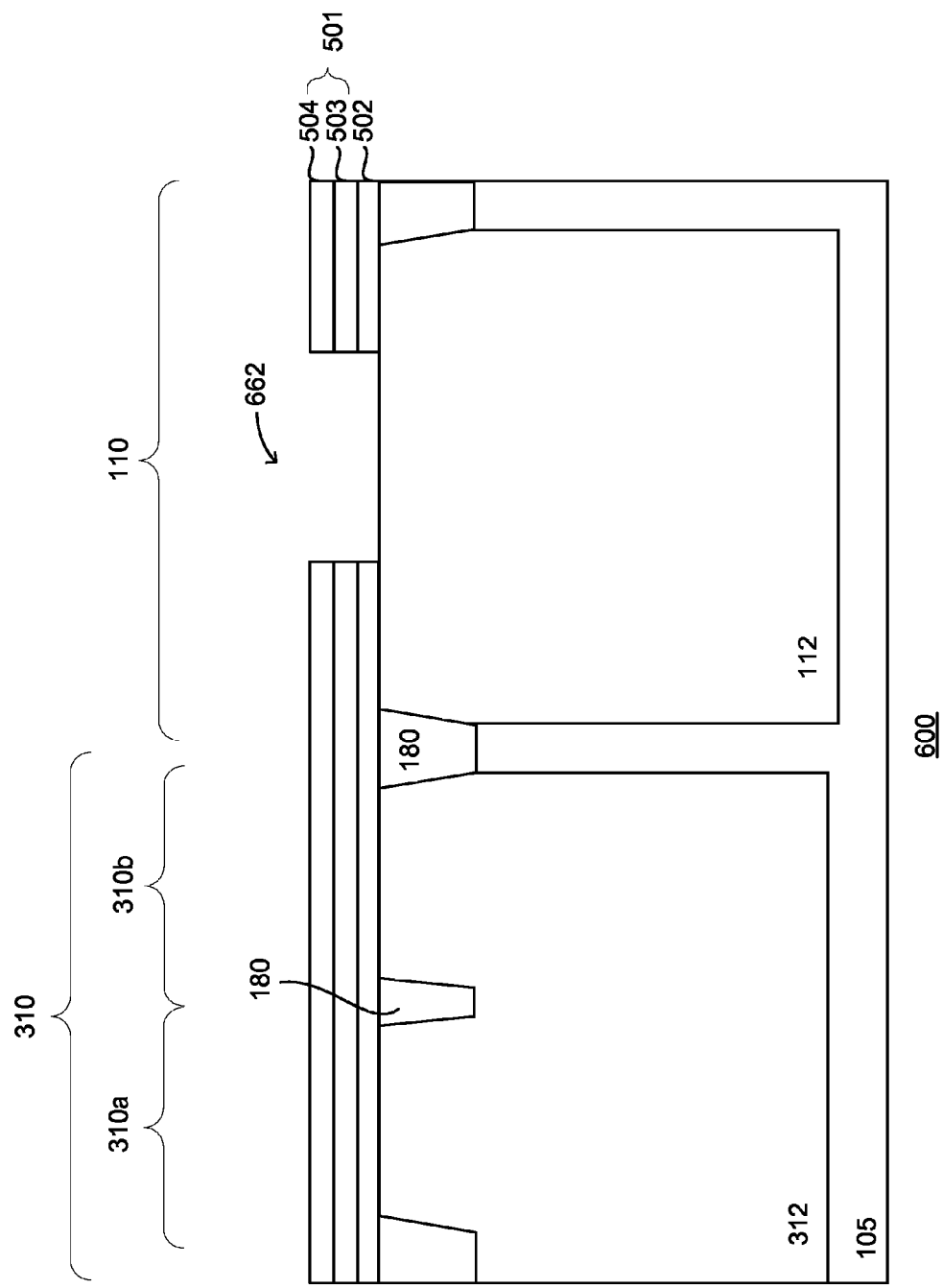
FIGS. 6a-n show cross-sectional views of a process of forming another embodiment of a device.
Figure 6B:
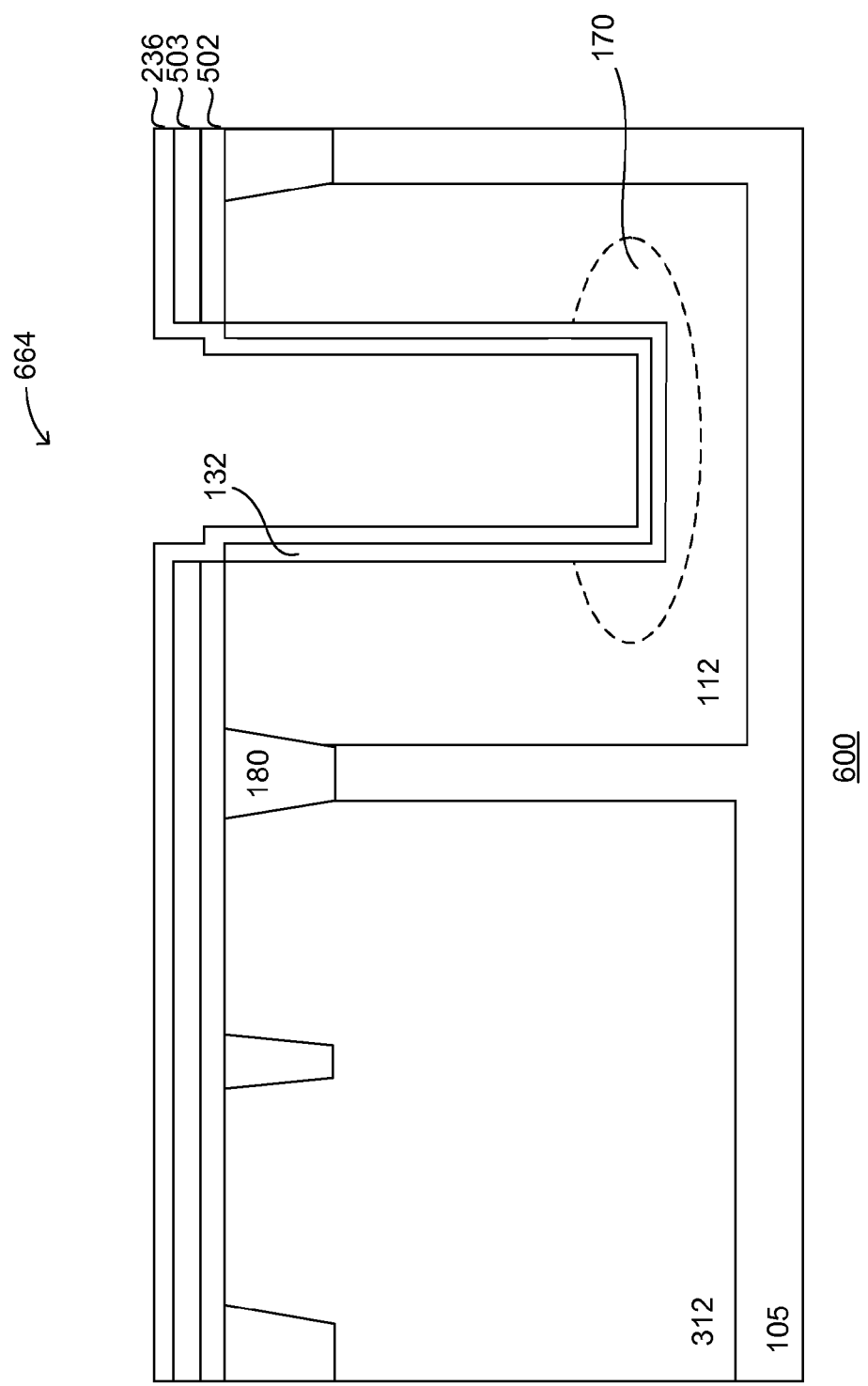
Figure 6C:
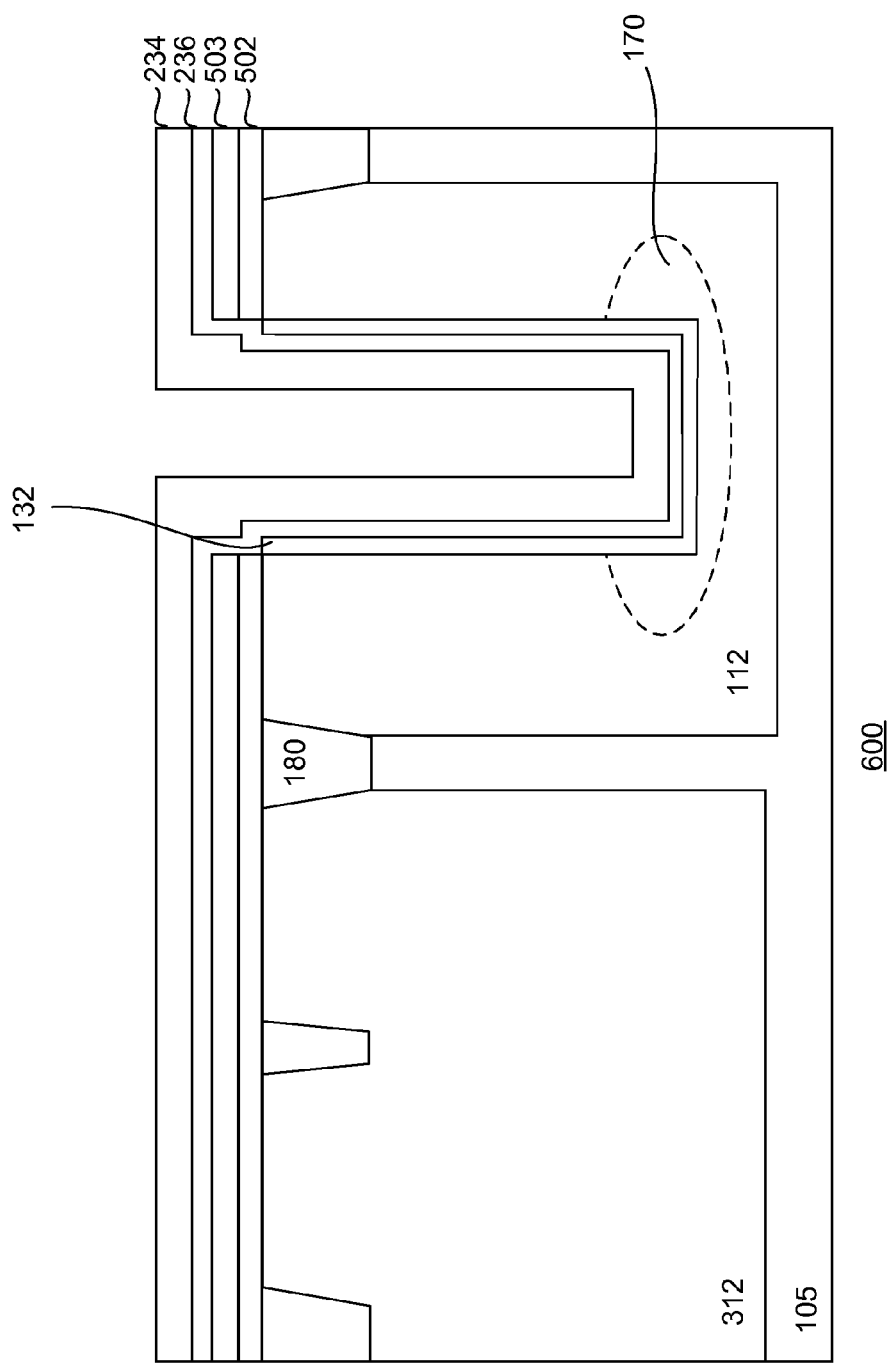
Figure 6D:
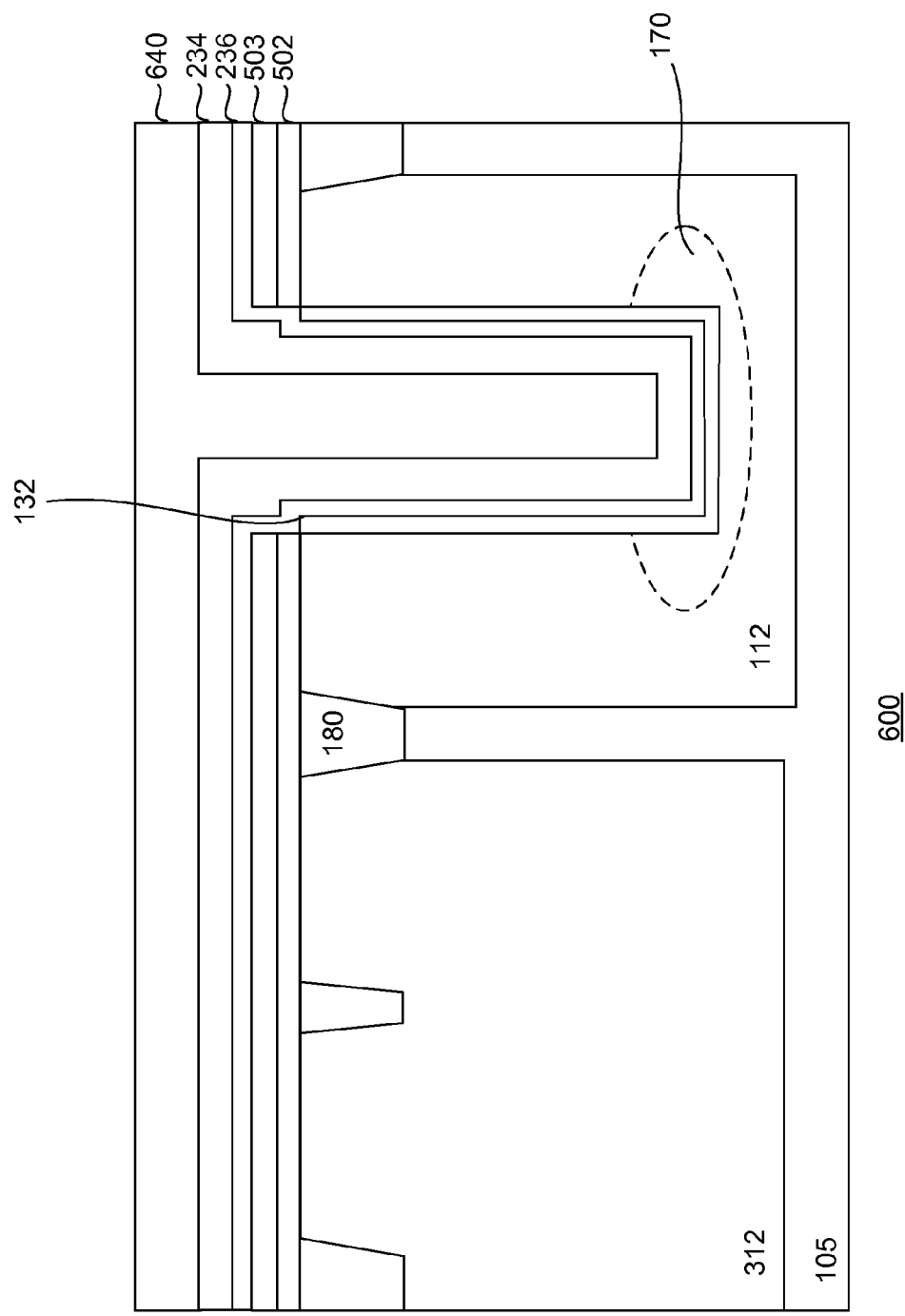
Figure 6E:
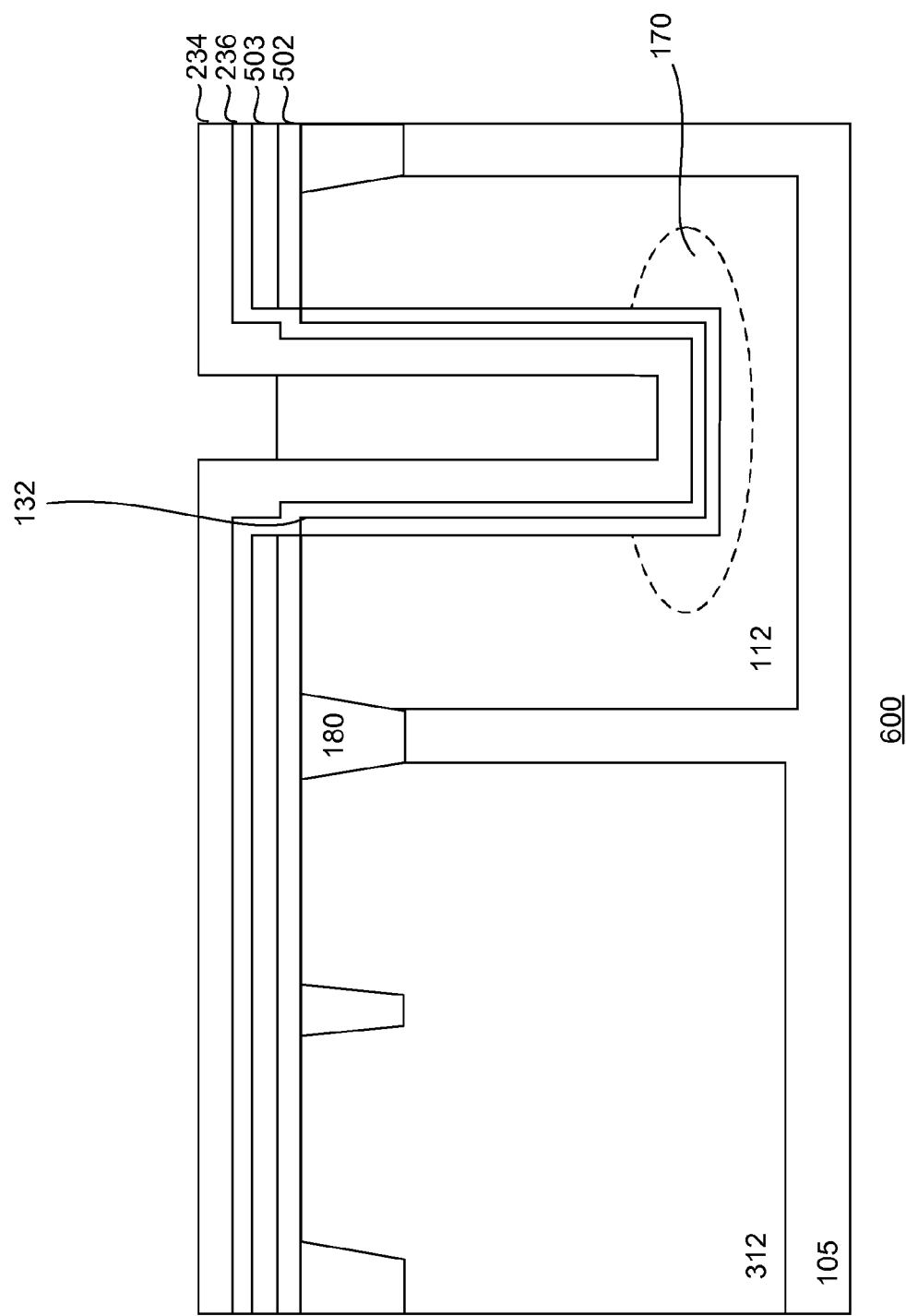
Figure 6F:
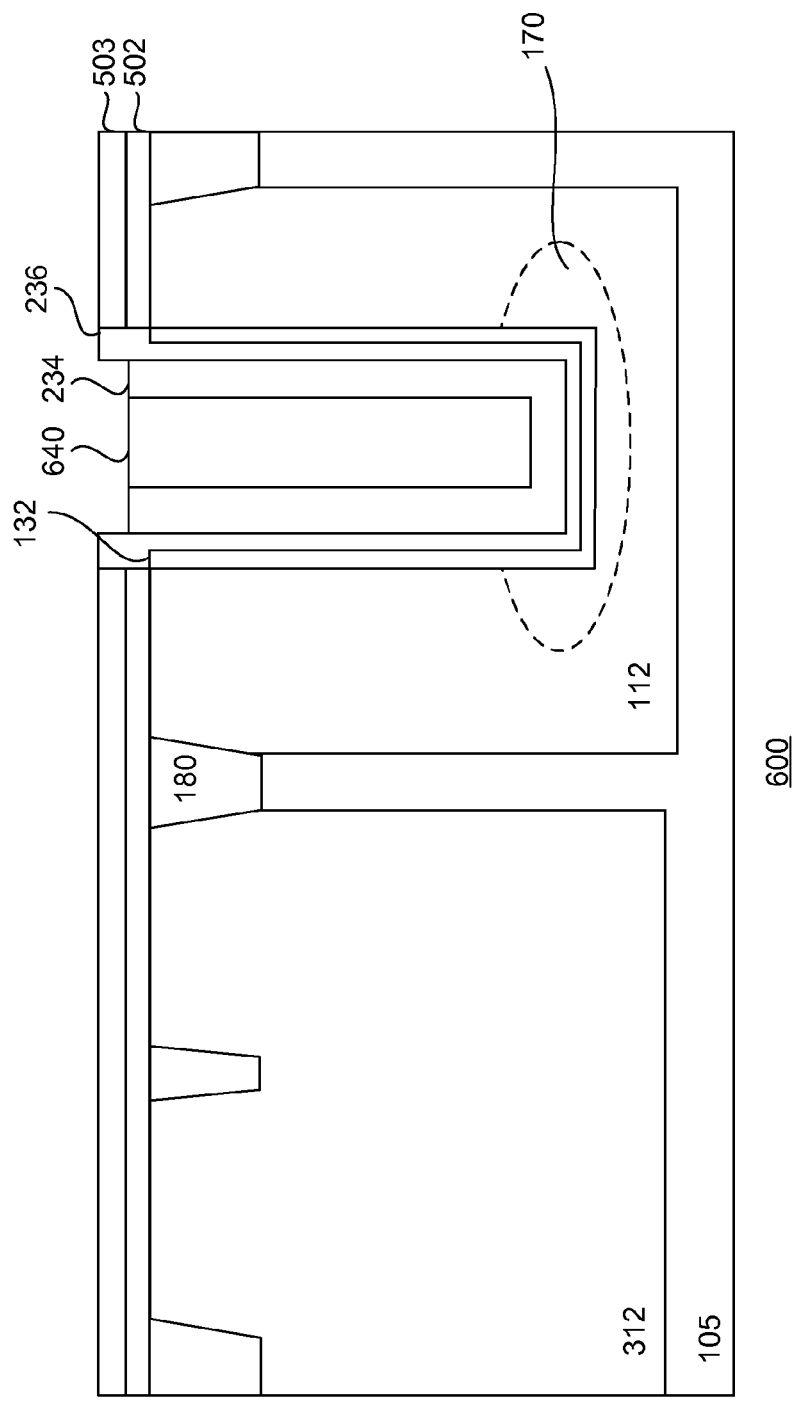
Figure 6G:
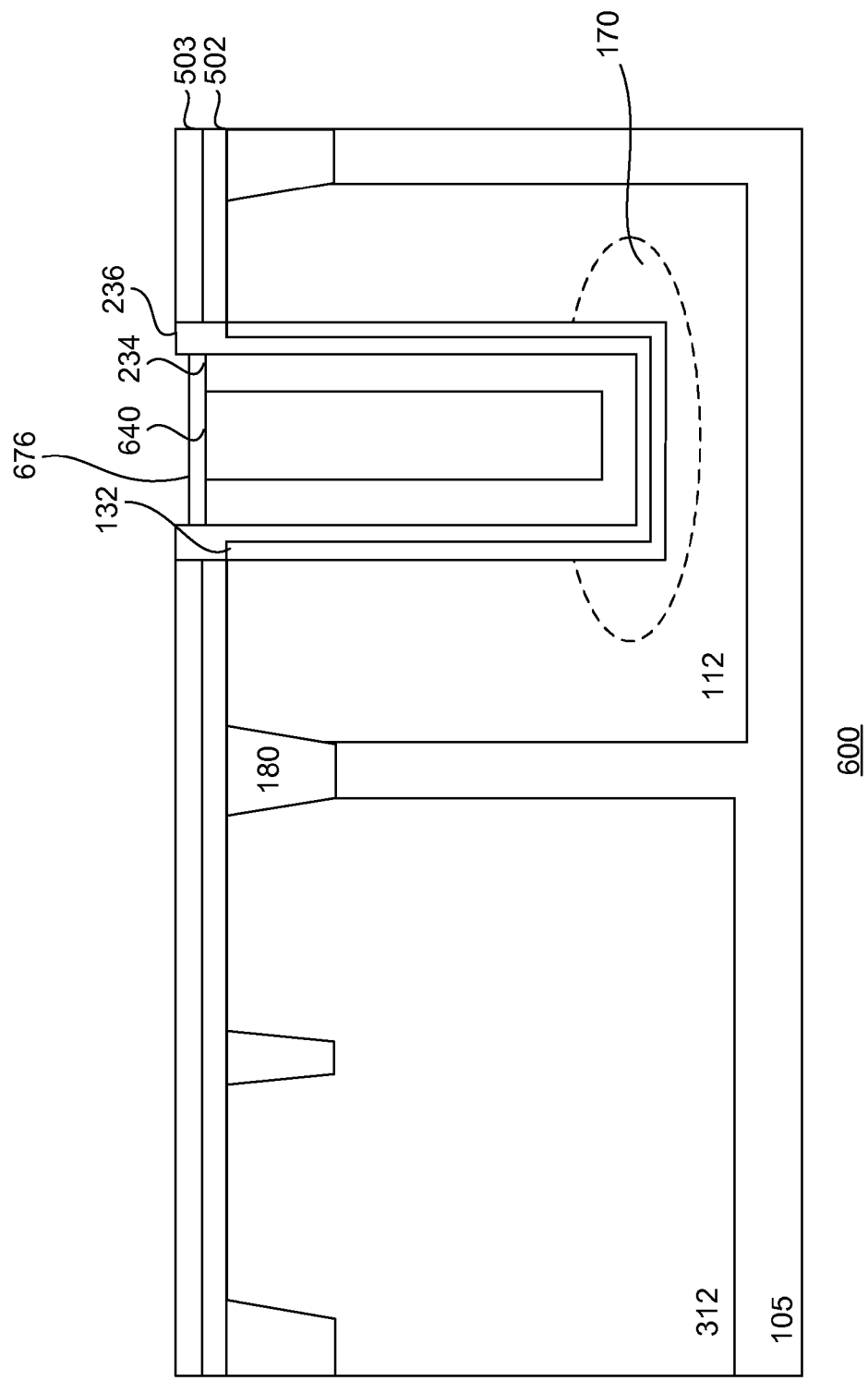
Figure 6I:
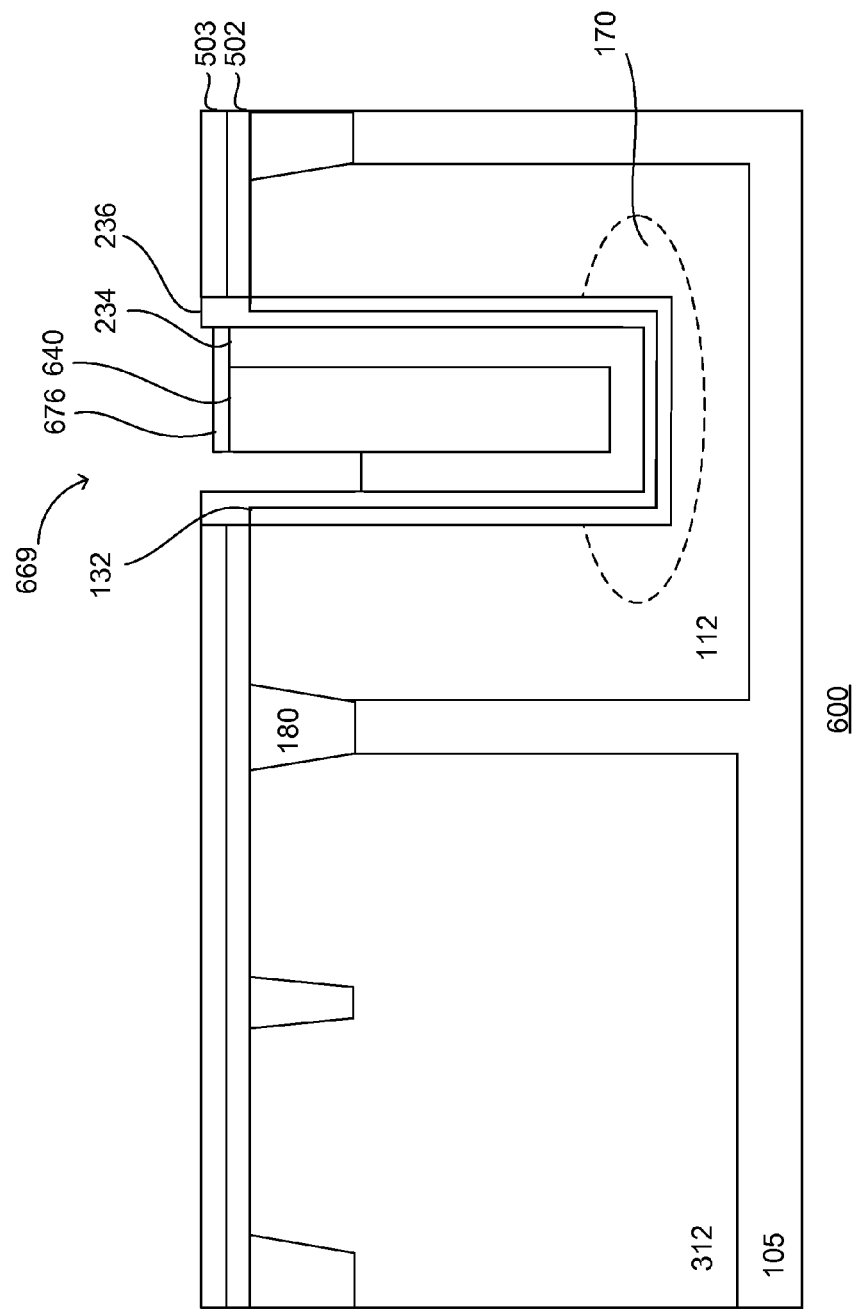
Figure 6J:
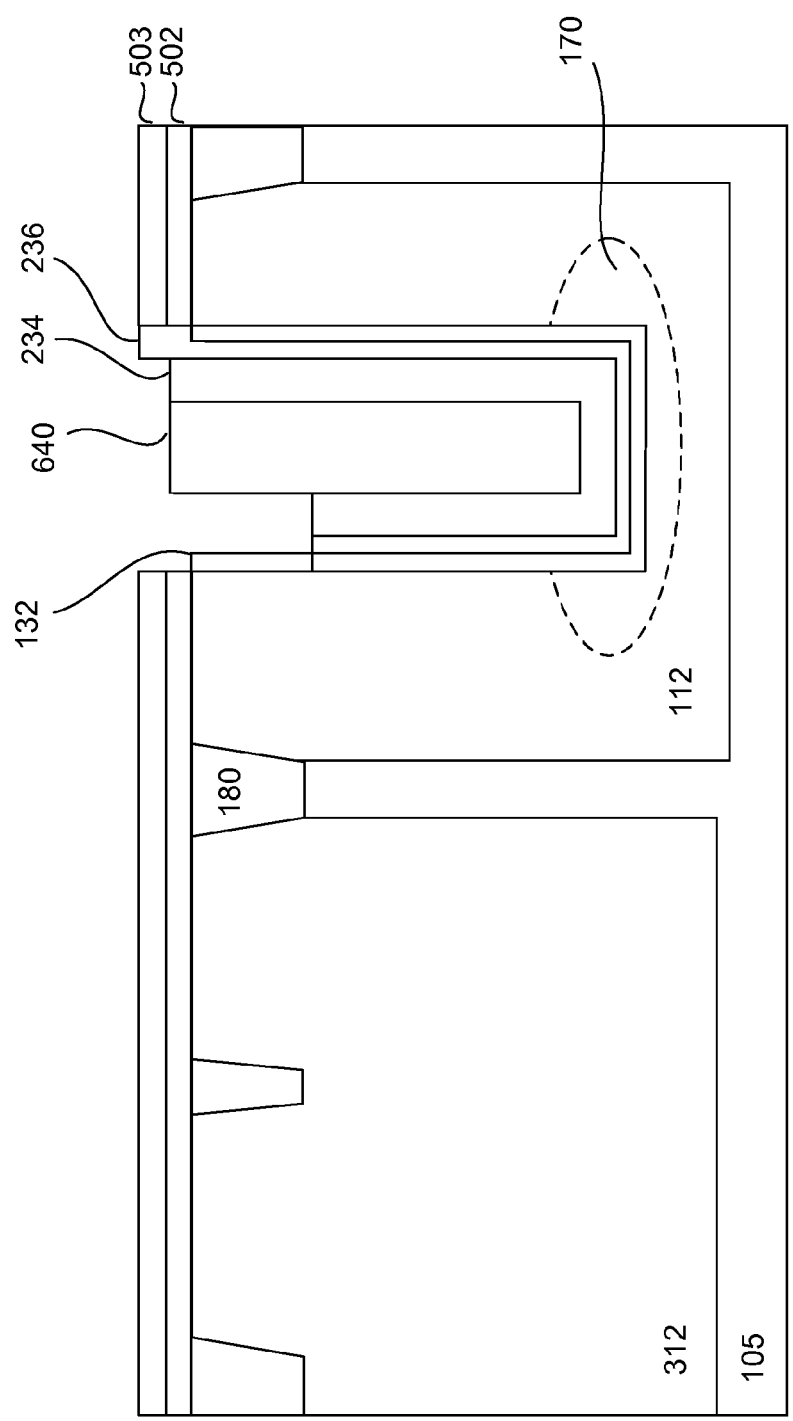
Figure 6K:
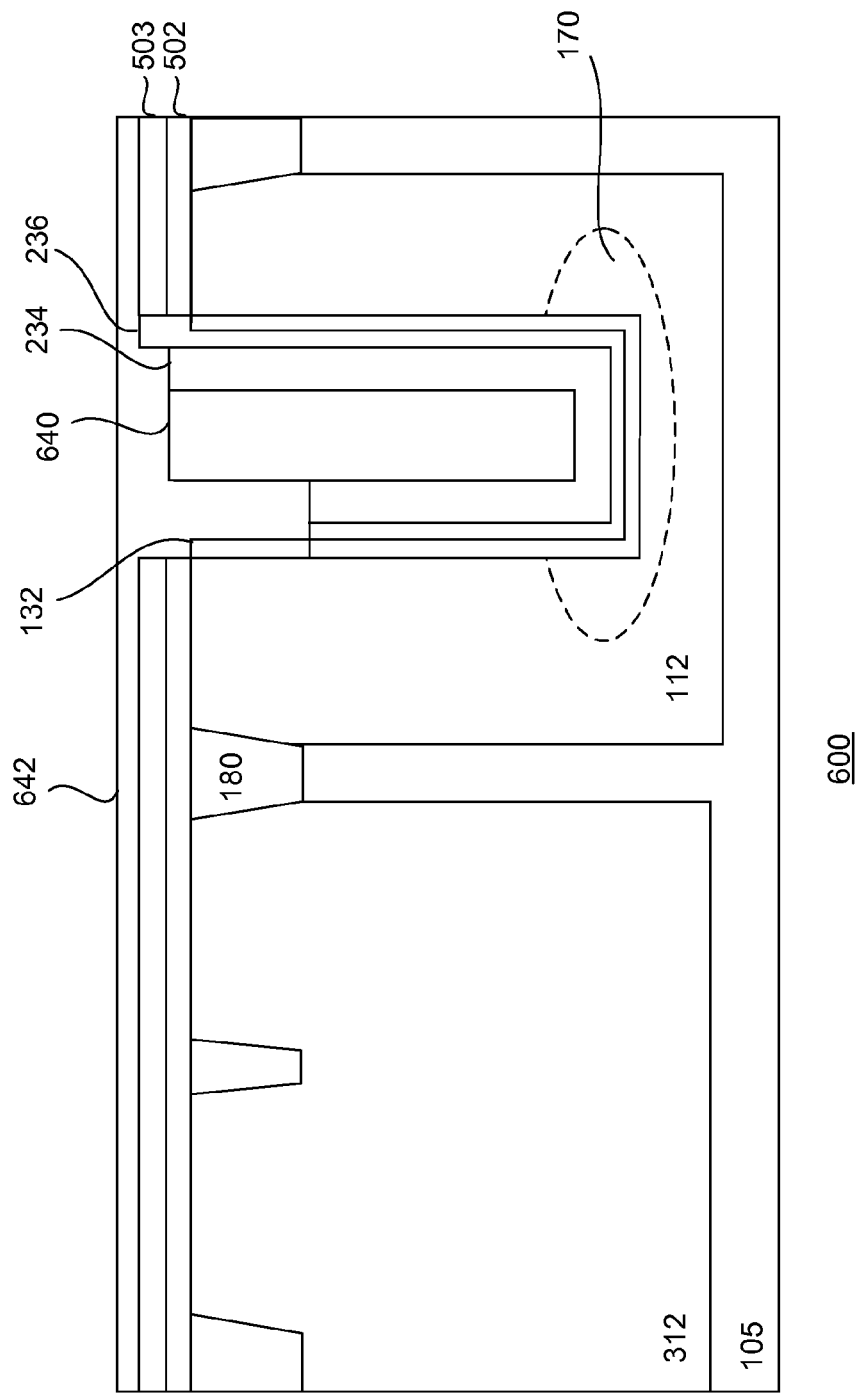
Figure 6I:
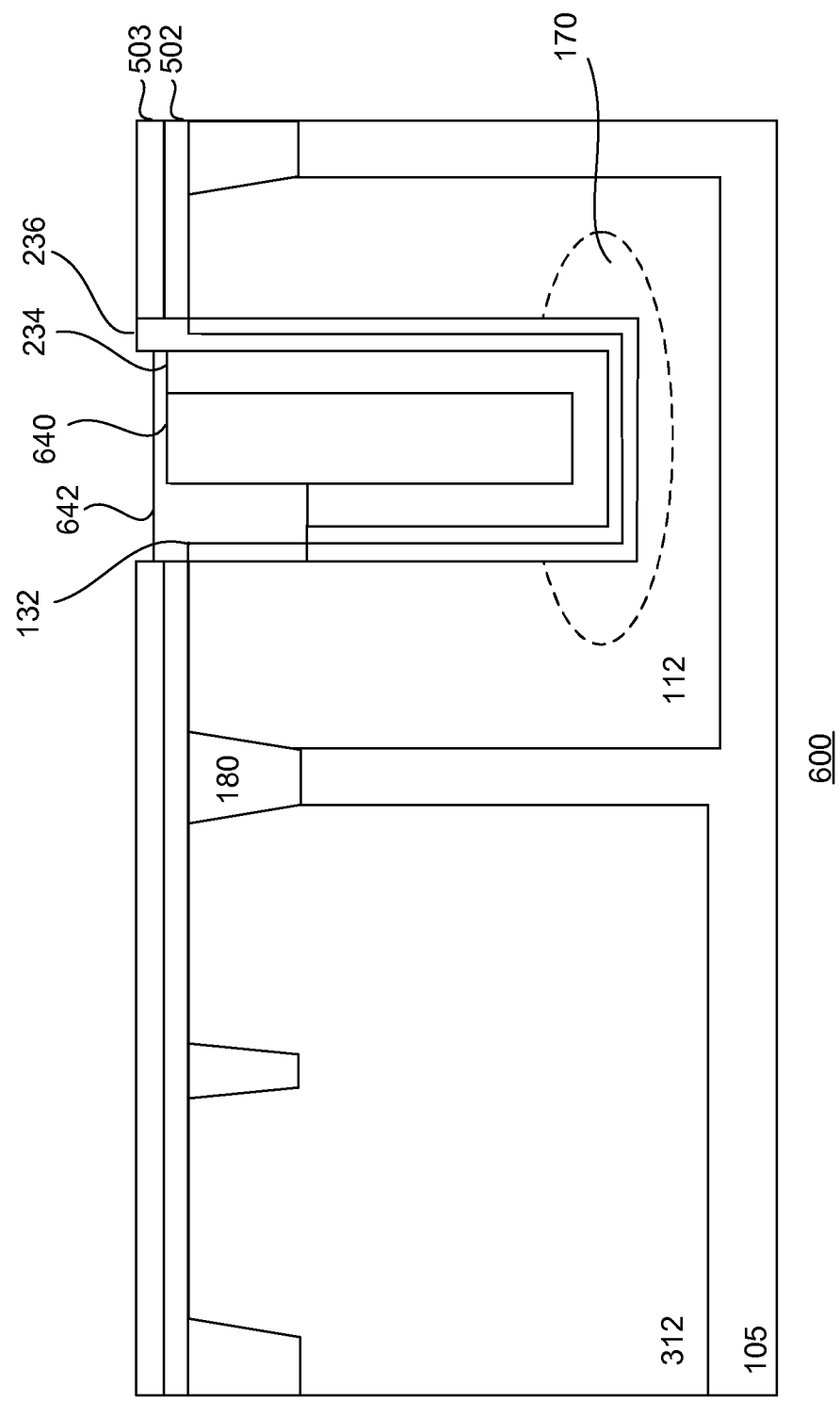
Figure 6M:
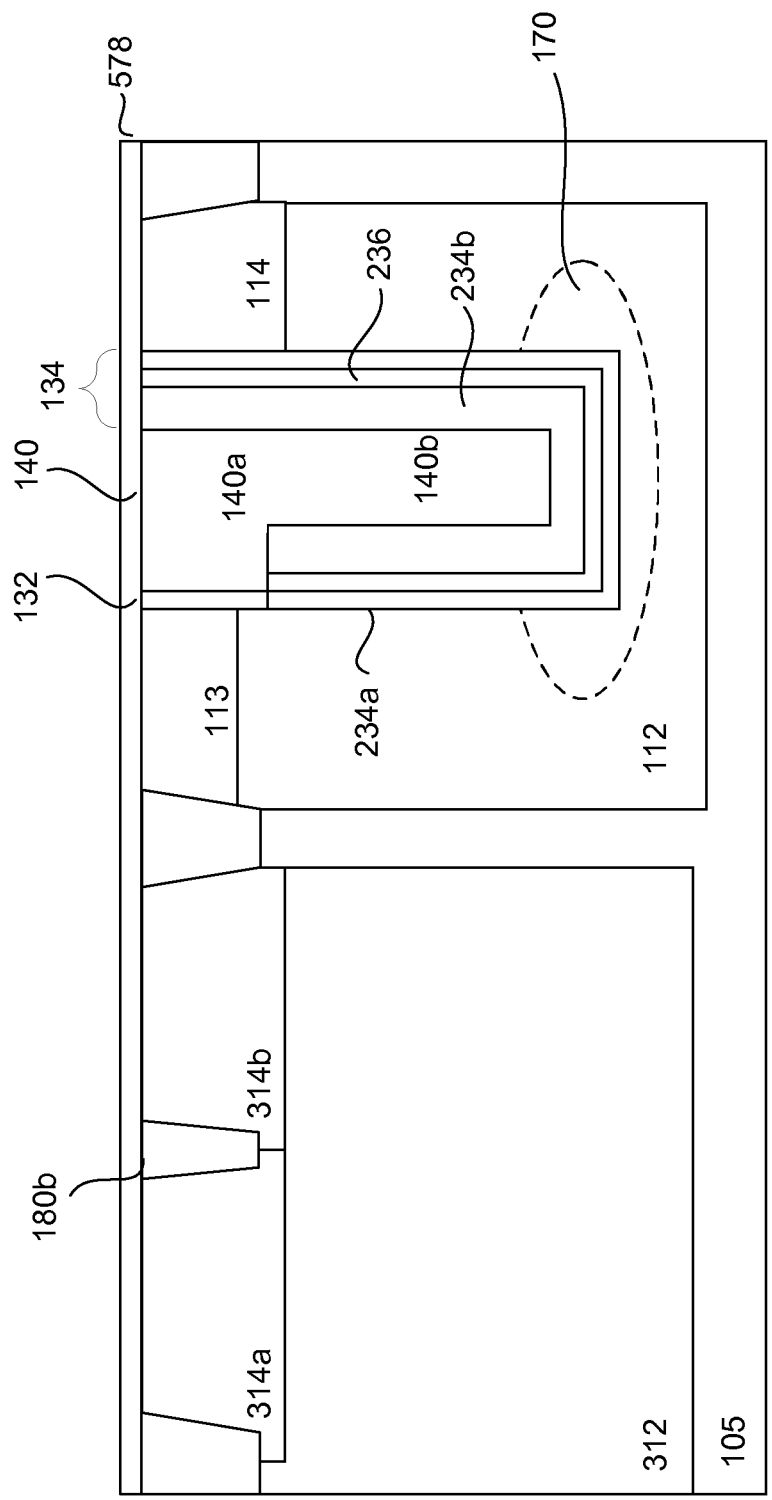
Figure 6N:
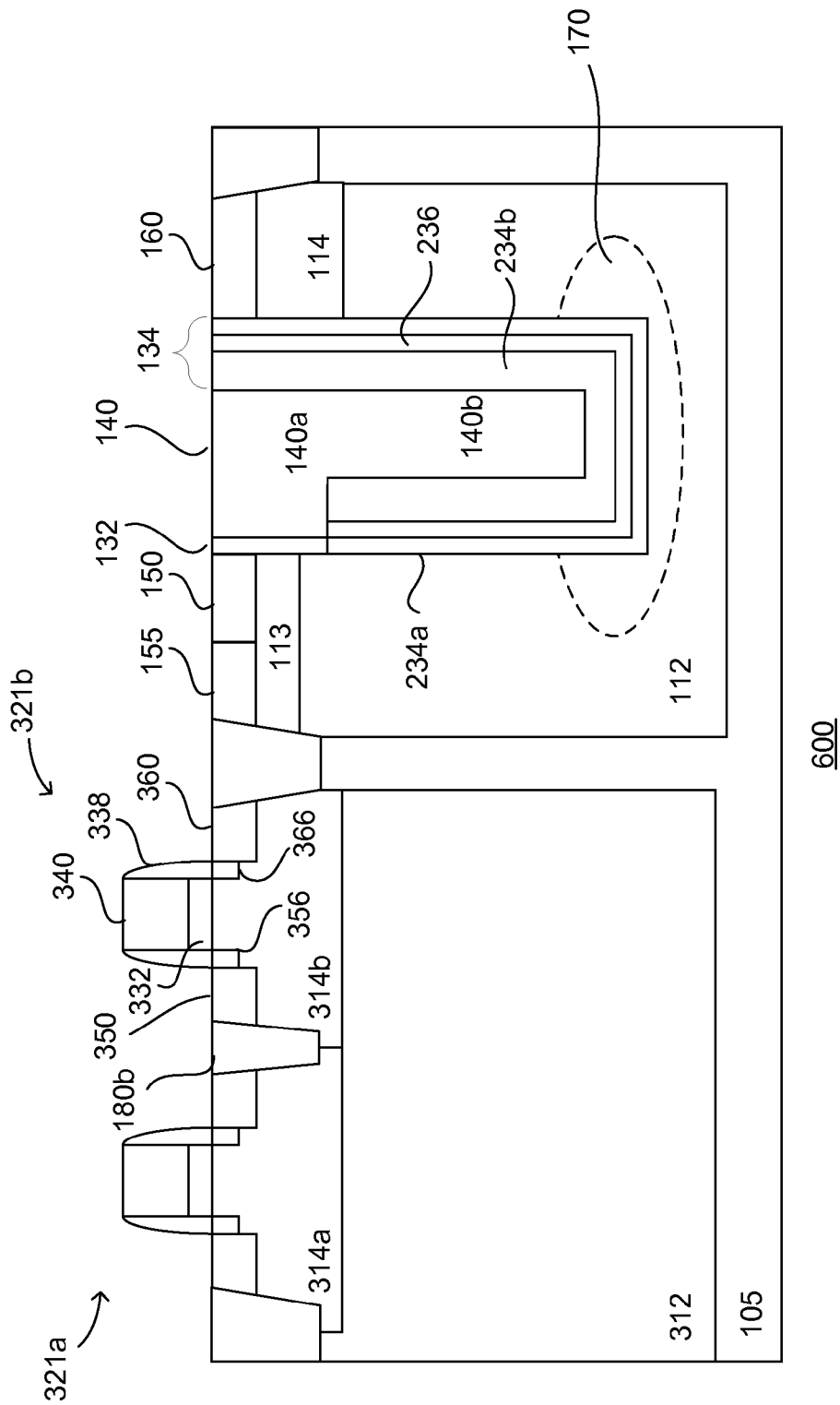

FIGS. 6a-n show cross-sectional views of an embodiment of a process 600 for forming a device or IC. Referring to FIG. 6a, a partially processed substrate 105 is provided. The substrate is at a stage of processing as described in FIG. 5b. As such, the common features need not be discussed. For example, the substrate includes HV and LV device regions 110 and 310 separated by isolation regions. A hard mask 501, including a pad layer 502, is disposed on the substrate. The hard mask includes an opening 662 corresponding to a trench which is to be formed in the HV device region of the substrate.

Referring to FIG. 6b, a first trench 664 is formed in the substrate. In one embodiment, the first trench is formed by a RIE, using the hard mask as an etch mask. For example, the RIE recesses the exposed substrate. The first trench formed has a depth from the surface of the substrate. The depth, for example, may be about 1-5 μm below the surface of the substrate. Other depths may also be useful. The depth, for example, is determined by the requirements of operative voltage.

The exposed trench walls, for example, are cleaned. For example, the trench walls are cleaned to remove any surface damage from the RIE etch. In one embodiment, the cleaning of the trench walls is performed by exposure to hydrogen plasma at a temperature in the range from about 200-400° C. for a period of from about 5-60 seconds. Other techniques for cleaning the exposed trench walls may also be useful.

Dopants are implanted into the substrate. In one embodiment, first polarity type dopants are implanted into the substrate. The implant forms a doped region at the bottom of the trench, using the first hard mask layer as an implant mask. An anneal is performed to diffuse and activate the dopants to form a buried doped region 170. The buried doped region, in one embodiment, surrounds the bottom of the trench. The buried doped region serves as a drift well of the device. In one embodiment, the buried doped region is an intermediate doped region with first polarity type dopants. For example, the buried doped region may be n doped regions for a n-type device. The dopant concentration, for example, may be about $5E13$-$5E15/cm^3$. Forming a buried doped region with other dopant concentrations may also be useful.

In one embodiment, after forming the buried doped region, the second hard mask layer 504 is removed. The second hard mask may be removed by, for example, a wet etch.

A first gate dielectric layer 132 is formed on the exposed trench walls. The first gate dielectric layer, in one embodiment, is silicon oxide. Other types of gate dielectric materials, such as silicon oxynitride, may also be useful. The first gate dielectric layer, in one embodiment, is formed by thermal process, such as thermal oxidation. For example, the first gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the first gate dielectric layer may be formed by a partial wet oxidation. The thermal process selectively forms the first gate dielectric layer on the exposed trench walls. Other techniques for forming the first gate dielectric layer may also be useful. The thickness of the first gate dielectric layer may be about 100-1000 Å. Other thicknesses for the first gate dielectric layer may also be useful.

An intermediate gate dielectric layer 236 is formed on the substrate, covering the first hard mask layer and the first gate dielectric layer. The intermediate gate dielectric, for example, is silicon nitride. Other types of intermediate gate dielectric materials may also be useful. The thickness of the intermediate gate dielectric layer may be about 50-500 Å. Other thicknesses for the intermediate gate dielectric layer may also be useful. The intermediate gate dielectric layer, for example, may be formed by chemical vapor deposition (CVD). Other techniques for forming the intermediate gate dielectric layer may also be useful. In the case that the intermediate gate dielectric layer is the same material as the first hard mask layer, the intermediate gate dielectric layer and the hard mask layer will be merged.

Referring to FIG. 6c, a second gate dielectric layer 234 is formed in the trench. In one embodiment, the second gate dielectric layer lines the inner surface of the intermediate gate dielectric layer, leaving a gap in the trench. The gap, for example, may be equal to the thickness of a lower gate electrode which will be formed subsequently. The second gate dielectric layer, in one embodiment, is silicon oxide. Other types of gate dielectric materials, such as silicon oxynitride, may also be useful. The second gate dielectric layer, in one embodiment, is formed by thermal process, such as thermal oxidation. For example, the second gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the second gate dielectric layer may be formed by a partial wet oxidation. Other techniques for forming the second gate dielectric layer may also be useful. The thickness of the second gate dielectric layer may be about 0.1-1 µm. Other thicknesses for the second gate dielectric layer may also be useful.

As shown in FIG. 6d, a first gate electrode layer 640 is formed on the substrate. The first gate electrode layer fills the gap in the trench and covers the substrate. In one embodiment, the second gate dielectric layer surrounds the first gate electrode layer. The first gate electrode layer, in one embodiment, is polysilicon. Other types of gate electrode material may also be useful. For example, the first gate electrode layer may be formed of tungsten. The first gate electrode layer may be formed by CVD. Other techniques of forming the first gate electrode layer may also be useful.

Referring to FIG. 6e, a planarization process may be performed to remove excess material of the first gate electrode layer. In one embodiment, the planarization process includes a polishing process, such as CMP. Other types of planarization processes may also be useful. For example, the planarization process may be an etch back process. In one embodiment, an over-polish is performed to recess the top surface of the first gate electrode layer below the surface of the hard mask. The over-polish, in one embodiment, recesses the top surface of the first gate electrode material in the trench to about the top surface of the pad layer.

A polishing process, such as CMP, is performed to remove excess material of the second gate dielectric layer and intermediate gate dielectric layer, as shown in FIG. 6f. Alternatively, the excess material of the second gate dielectric layer and intermediate gate dielectric layer are removed by an etch back process. For example, excess material of the second gate dielectric layer and intermediate gate dielectric layer on the surface of the hard mask is removed. In one embodiment, an over-polish is performed to recess the top surface of the second gate dielectric layer below the surface of the first hard mask layer. The over-polish, in one embodiment, recesses the top surface of the second gate dielectric layer in the trench to about the top surface of the first gate electrode layer.

Referring to FIG. 6g, a liner layer 676 is formed on the substrate, covering the first gate electrode layer and second gate dielectric layer in the trench. The liner layer, in one embodiment, is silicon nitride. Other types of liner materials may also be useful. In one embodiment, the liner layer is of the same material as the first hard mask layer. Providing a liner layer which is formed from a material different than that of the first hard mask layer is also useful. The thickness of the liner layer may be about 50-1000 Å. Other thicknesses for the liner layer may also be useful. The liner layer, for example, may be formed by chemical vapor deposition (CVD). Other techniques for forming the sacrificial layer may also be useful.

Referring to FIG. 6h, a soft mask 605 is formed on the substrate. The soft mask, as shown, is selectively patterned to create an opening 665 to expose a portion of the liner layer in the trench. In one embodiment, the opening exposes a portion of the second gate dielectric layer on the source side of the trench. For example, the soft mask protects the first gate electrode and the second gate dielectric layer disposed on the drain side of the trench. The soft mask, for example, is formed of a photoresist. The soft mask serves as an etch mask to remove the exposed portion of the liner layer. The etch, for example, is a RIE.

As shown in FIG. 6i, the substrate is etched, for example, by an RIE using the soft mask as an etch mask. The etch forms a second trench 669 in the substrate, exposing a vertical portion of the intermediate gate dielectric layer and first gate electrode. The depth of the second trench is equal to about an upper portion. For example, the depth of the second trench is about 1-5 µm from the surface of the substrate. Other depths may also be useful. After forming the trench, the soft mask is removed by, for example, ashing.

In FIG. 6j, the exposed portion of the intermediate gate dielectric layer and liner layer are removed. Removal, for example, is achieved with a wet etch. The wet etch selectively removes the exposed portion of the intermediate gate dielectric and liner layer, exposing a portion of the first dielectric layer and tops of the gate electrode and second gate dielectric layer. The etch forms part of an upper portion of the trench.

Referring to FIG. 6k, a second gate electrode layer 642 is formed on the substrate. The second gate electrode layer fills the trench and covers the substrate. The trench filled with the second gate electrode layer together with the existing adjacent first gate electrode layer form an upper gate electrode 140a of the transistor, whereas the narrower part of the trench filled with the first gate electrode layer forms a lower gate electrode 140b of the transistor. The upper gate electrode serves as a gate electrode of the transistor while the lower gate electrode serves as a gate field plate of the transistor.

The second gate electrode layer, in one embodiment, is polysilicon. Other types of gate electrode material may also be useful. For example, the second gate electrode layer may be formed of tungsten. In one embodiment, the first and second gate electrode layersareformed of same material. The second gate electrode layer may be formed by CVD. Other techniques of forming the second gate electrode layer may also be useful.

Referring to FIG. 6l, a planarization process is performed to remove excess material of the second gate electrode layer. In one embodiment, the planarizing process includes a polishing process, such as CMP. Other types of planarization processes may also be. Alternatively, the excess material of the second gate electrode layer is removed by an etch back process. In one embodiment, an over-polish is performed to recess a top surface of the second gate electrode layer below the first hard mask. In one embodiment, the over-polish recesses the top of the second gate electrode layer in the trench below the top surface of the first hard mask layer. As shown, the top of the second gate electrode layer is above the first gate electrode layer.

In FIG. 6m, the first hard mask isremoved. The first hard mask is removed by, for example, a wet etch. A screen oxide layer 578 may be formed on the surface of the substrate. The process continues as described in FIG. 5p and onwards.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A method of forming a device comprising:
providing a substrate defined with a device region, wherein the device region comprises a first polarity type first doped well;
forming a gate having an upper and a lower portion in a trench in the substrate, wherein the upper portion forms a gate electrode and the lower portion forms a gate field plate;
forming second and third doped wells disposed within the first doped well, wherein
the second doped well comprises first polarity type dopants and the third doped well comprises second polarity type dopants,
the second doped well comprises a dopant concentration different to the first doped well, and
the third doped well comprises a depth shallower than the gate electrode;
forming first and second surface doped regions adjacent to the gate; and
wherein the gate field plate introduces a vertical reduced surface (RESURF) effect in a drift region of the device.

2. The method of claim 1 further comprising forming a buried doped region in the substrate.

3. The method of claim 2 wherein the buried doped region is disposed below the gate.

4. The method of claim 1 wherein the device region is surrounded by device isolation regions.

5. The method of claim 4 wherein the device region comprises one or more internal device isolation regions, dividing the device region into multiple device sub-regions.

6. The method of claim 5 comprising:
forming an intermediate voltage device and a low voltage device in the multiple device sub-regions, wherein the intermediate voltage device and the low voltage device comprise
a gate having a gate electrode and gate dielectric,
source/drain regions adjacent to the gate, and
a channel disposed in the substrate under the gate between the source/drain regions.

7. The method of claim 4 wherein the second surface doped region is disposed in the second doped well and the first surface doped region is disposed in the third doped well.

8. The method of claim 1 wherein forming the gate in the trench comprises:
forming the trench in the first doped well, the trench having an upper and a lower portion;
forming a first gate dielectric in the upper portion of the trench adjacent to the first surface doped region;
forming a second gate dielectric layer in the upper portion of the trench adjacent to the second surface doped region and the lower portion of the trench;
forming the gate electrode having upper and lower portions in the trench;
wherein the first gate dielectric lines an inner edge of the upper gate electrode; and
wherein the second gate dielectric surrounds the lower gate electrode and an outer edge of the upper gate electrode.

9. The method of claim 8 wherein the first gate dielectric wraps around to line a portion of the bottom of the upper gate electrode.

10. The method of claim 8 wherein the second gate dielectric is a multi-layered dielectric stack.

11. The method of claim 10 wherein the second gate dielectric is an oxide-nitride-oxide (ONO) stack.

12. The method of claim 8 wherein forming the trench comprises:
forming the upper portion of the trench, wherein exposed sidewalls of the trench are lined with a gate dielectric layer;
lining a spacer layer on the gate dielectric layer;
forming a sidewall spacer on a first sidewall of the upper portion of the trench adjacent to the first surface doped region; and
etching the substrate to form the lower portion of the trench, wherein the sidewall spacer serves as an etching mask.

13. The method of claim 1 wherein an inner edge of the gate field plate is offset from an inner edge of the gate electrode.

14. A method of forming a semiconductor device comprising:
providing a substrate defined with a device region, wherein the device region comprises a first polarity type first doped well;
forming a gate having an upper and a lower portion in a trench in the substrate, the upper portion forms a gate electrode and the lower portion forms a gate field plate, wherein an inner edge of the gate field plate is offset from an inner edge of the gate electrode;
forming second and third doped wells disposed within the first doped well, wherein
the second doped well comprises first polarity type dopants and the third doped well comprises second polarity type dopants,
the second doped well comprises a dopant concentration different to the first doped well, and
the third doped well comprises a depth shallower than the gate electrode;
forming first and second surface doped regions adjacent to the gate; and
wherein the gate field plate introduces a vertical reduced surface (RESURF) effect in a drift region of the device.

15. The method of claim 14 wherein forming the gate in the trench comprises:
forming the trench in the substrate, the trench having an upper and a lower portion;
forming a first gate dielectric in the upper portion of the trench adjacent to the first surface doped region;
forming a second gate dielectric layer in the upper portion of the trench adjacent to the second surface doped region and the lower portion of the trench;
forming the gate electrode having upper and lower portions in the trench;
wherein the first gate dielectric lines an inner edge of the upper gate electrode; and
wherein the second gate dielectric surrounds the lower gate electrode and an outer edge of the upper gate electrode.

16. The method of claim 15 wherein the first gate dielectric wraps around to line a portion of the bottom of the upper gate electrode.

17. The method of claim 15 wherein the second gate dielectric is a multi-layered dielectric stack.

18. The method of claim 17 wherein the second gate dielectric is an oxide-nitride-oxide (ONO) stack.

19. A semiconductor device comprising:
a substrate comprising a first polarity type first doped well;
a gate having an upper and a lower portion in a trench in the substrate, wherein the upper portion forms a gate electrode and the lower portion forms a gate field plate;
second and third doped wells disposed within the first doped well, wherein
  the second doped well comprises first polarity type dopants and the third doped well comprises second polarity type dopants,
  the second doped well comprises a dopant concentration different to the first doped well, and
  the third doped well comprises a depth shallower than the gate electrode;
first and second surface doped regions adjacent to the gate; and
wherein the gate field plate introduces a vertical reduced surface (RESURF) effect in a drift region of the device.

20. The semiconductor device of claim 19 wherein the second surface doped region is disposed in the second doped well and the first surface doped region is disposed in the third doped well.

\* \* \* \* \*